United States Patent [19]

Kobayashi et al.

[11] Patent Number: 5,542,600
[45] Date of Patent: Aug. 6, 1996

[54] AUTOMATIC SOLDERING APPARATUS, APPARATUS AND METHOD FOR TEACHING SAME, SOLDERING INSPECTION APPARATUS AND METHOD, AND APPARATUS AND METHOD FOR AUTOMATICALLY CORRECTING SOLDERING

[75] Inventors: Shigeki Kobayashi; Norihito Yamamoto, both of Kyoto, Japan

[73] Assignee: Omron Corporation, Kyoto, Japan

[21] Appl. No.: 232,022

[22] PCT Filed: Nov. 9, 1992

[86] PCT No.: PCT/JP92/01448

§ 371 Date: Apr. 26, 1994

§ 102(e) Date: Apr. 26, 1994

[87] PCT Pub. No.: WO93/09654

PCT Pub. Date: May 13, 1993

[30] Foreign Application Priority Data

Nov. 7, 1991 [JP] Japan .................. 3-321286
Nov. 11, 1991 [JP] Japan .................. 3-323680
Nov. 19, 1991 [JP] Japan .................. 3-331170

[51] Int. Cl.$^6$ .................................................. B23K 1/19
[52] U.S. Cl. ............................. 228/102; 228/103; 228/7; 228/9
[58] Field of Search .................... 228/7, 9, 102, 228/103

[56] References Cited

U.S. PATENT DOCUMENTS

| 4,667,403 | 5/1987 | Edinger et al. . | |
|---|---|---|---|
| 5,094,382 | 3/1992 | Shimizu | 228/102 |
| 5,197,650 | 3/1993 | Monzen et al. | 228/7 |

FOREIGN PATENT DOCUMENTS

| 0346839 | 12/1989 | European Pat. Off. . | |
|---|---|---|---|
| 0373376 | 6/1990 | European Pat. Off. . | |
| 0456218 | 11/1991 | European Pat. Off. . | |
| 0477430 | 4/1992 | European Pat. Off. . | |
| 0515910 | 12/1992 | European Pat. Off. . | |
| 0526080 | 2/1993 | European Pat. Off. . | |
| 57-59341 | 4/1982 | Japan | 228/102 |
| 60-260200 | 12/1985 | Japan . | |
| 62-92395 | 4/1987 | Japan . | |
| 1-191429 | 8/1989 | Japan | 228/102 |
| 1-227442 | 9/1989 | Japan | 228/102 |
| 1-312608 | 12/1989 | Japan . | |
| 1-321131 | 12/1989 | Japan . | |
| 2-296 | 1/1990 | Japan . | |
| 2-7535 | 1/1990 | Japan | 228/7 |
| 2-76080 | 3/1990 | Japan . | |
| 2-231800 | 9/1990 | Japan . | |
| 2-254503 | 10/1990 | Japan . | |
| 2-246191 | 10/1990 | Japan . | |
| 4-17400 | 1/1992 | Japan . | |
| 4-123203 | 4/1992 | Japan . | |
| 4-105860 | 4/1992 | Japan . | |
| 5-26815 | 2/1993 | Japan . | |
| 5-35849 | 2/1993 | Japan . | |
| 5-303579 | 11/1993 | Japan . | |

OTHER PUBLICATIONS

Supplementary European Search Report and Annex dated Mar. 9, 1995, and Communication mailed Mar. 23, 1995.

*Primary Examiner*—P. Austin Bradley
*Assistant Examiner*—Jeffrey T. Knapp
*Attorney, Agent, or Firm*—Fish & Richardson P.C.

[57] ABSTRACT

Soldering condition information such as the position and angle of a soldering iron, amount of solder supplied and heating time is stored beforehand, for each grouping of parts, in a part classification table (26) for soldering purposes. Parts to be mounted on a board are stored, in correspondence with the board ID, on a floppy disk of a floppy disk device (24). When the board ID is entered, the parts to be mounted on the board are displayed on a display unit (23). The operator reads out the part classification table (26) for soldering purposes and designates soldering correction information that corresponds to the part groups to which the parts belong. As a result, a teach-data table (27) in which soldering condition information has been stored in correspondence with the parts is created. Soldering is executed automatically in accordance with the teach-data table (27).

46 Claims, 24 Drawing Sheets

Fig. 3

| PART TYPE | PART GROUP | SOLDERING CONDITION INFORMATION |
|---|---|---|
| A | A 1 | POSITION, ANGLES, AMOUNT OF SOLDER SUPPLIED, HEATING TIME |
| | A 2 | ⋯⋯ |
| | A 3 | ⋯⋯ |
| | ⋮ | ⋮ |
| | A 8 | |
| B | B 1 | |
| | B 2 | |
| | ⋮ | ⋮ |
| ⋮ | ⋮ | ⋮ |
| G | ⋮ | ⋮ |
| | G 4 | |
| | G 5 | ⋯⋯ |

Fig.8

| BOARD NAME | PART POSITION | SOLDERING CONDITION INFORMATION |
|---|---|---|
|  |  |  |
|  |  |  |
|  |  |  |
|  |  |  |

Fig.15
| | SOLDERING ACCEPTABLE | PART MISSING | INSUFFICIENT SOLDER |
|---|---|---|---|
| SECTIONAL VIEW | 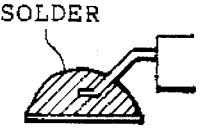 |  | 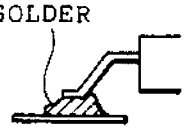 |
| IMAGED PATTERN | 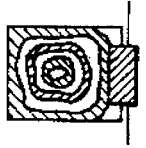 | 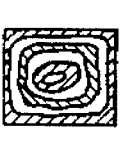 | 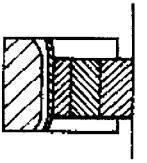 |
| RED PATTERN | 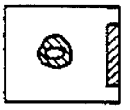 |  | 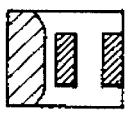 |
| GREEN PATTERN | 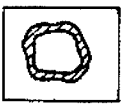 |  |  |
| BLUE PATTERN | 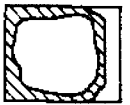 | 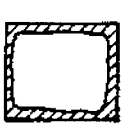 |  |

Fig. 16

| PART TYPE | PART GROUP | IMAGE INFORMATION NECESSARY FOR INSPECTION OF MOUNTED PARTS, AND INFORMATION RELATING TO CRITERIA |
|---|---|---|
| A | A 1 | ・・・・・ |
| A | A 2 | ・<br>・<br>・<br>・ |
| B | B 1 | ・・・・・ |
| B | B 2 | ・<br>・<br>・ |

Fig. 17

| PART TYPE | PART GROUP | CORRECTION CONDITION INFORMATION |
|---|---|---|
| A | | ・・・・・ |
| A | | ・<br>・<br>・<br>・ |
| B | | ・・・・・ |
| B | | ・<br>・<br>・<br>・ |

Fig.21

| BOARD NAME | PART POSITION | CRITERIA, ETC. |
|---|---|---|
|  |  |  |
|  |  |  |
|  |  |  |
|  |  |  |

Fig.22

| BOARD NAME | PART POSITION | POSITION INFORMATION OF FAULTY LOCATION + CORRECTION CONDITION INFORMATION |
|---|---|---|
|  |  |  |
|  |  |  |
|  |  |  |
|  |  |  |

Fig. 27

| BOARD NAME | PART POSITION | SOLDERING CORRECTION CONDITION INFORMATION |
|---|---|---|
|  |  |  |
|  |  |  |
|  |  |  |
|  |  |  |

AUTOMATIC SOLDERING APPARATUS, APPARATUS AND METHOD FOR TEACHING SAME, SOLDERING INSPECTION APPARATUS AND METHOD, AND APPARATUS AND METHOD FOR AUTOMATICALLY CORRECTING SOLDERING

TECHNICAL FIELD

This invention relates to an automatic soldering apparatus for performing soldering automatically to effect electrical connections in order to mount electronic parts on a printed circuit board, an apparatus for a method of teaching soldering condition information, which is necessary for soldering, to the automatic soldering apparatus, a soldering inspection apparatus and method functioning to judge whether a soldered location is acceptable or not and generate information indicative of soldering correction conditions in order to correct a defective location in a case of a soldering defect, and an automatic soldering correction apparatus and method for automatically correcting a faulty soldered location.

BACKGROUND ART

Soldering apparatus presently available include a soldering apparatus that relies upon a flow soldering method in which a board on which electronic parts have been mounted in advance is dipped in a soldering bath to perform soldering, and a soldering apparatus that relies upon a reflow soldering method in which electronic parts are placed on a soldering cream that has been applied to part mounting positions on the surface of a board and the electronic parts are welded by application of heat.

However, each of these conventional soldering apparatus can be applied only to cases in which identical soldering conditions hold for all parts; they cannot be applied to cases where parts having markedly different thermal capacities or parts having a very small pitch between their leads are mounted on a board. These apparatus require that such parts be soldered individually manually or by robot.

The development of electronics manufacturing techniques has been accompanied by a diversification in the form of the electronic parts used. An increase in specially ordered parts and parts of a type different from the standard type has been accompanied by an increase in soldering locations that are unsuited to blanket soldering by soldering apparatus of the above-mentioned kind, and boards appear which require that all parts be soldered under individual conditions.

Practical application of an automatic soldering apparatus capable of performing soldering on a board automatically under soldering conditions that differ for each part is desired. In such an automatic soldering apparatus, it is required that the positions at which parts are to be soldered, the kinds of parts and the kinds of soldering conditions be instructed for each type of board before the soldering operation. The instructing operation is referred to as "teaching". The data taught includes information relating to part mounting positions on the board, types of parts to be mounted and soldering conditions necessary for automatic soldering.

In order to manually enter soldering conditions for each type of board and for each type of part, however, a great amount of time and labor is required and the automatic soldering apparatus cannot be operated during the teaching operation.

With regard to a printed circuit board on which many parts have been mounted by soldering, it is required that an inspection be performed after the soldering operation in order to determine whether soldering has been carried out appropriately. In order to meet this goal, automatic inspection apparatus that use image processing techniques to automatically inspect the quality of the soldered locations of each part on printed circuit boards having a large number of parts mounted thereon are being put into practical use. These automatic inspection apparatus detect the positions of faulty soldered locations on a printed circuit board as well as the types of faults and print out the results of detection on prescribed recording paper.

FIG. 30 illustrates a specific example of a recording paper 300 outputted by an automatic inspection apparatus. Numeral 301 denotes the outline of a printed circuit board, and number 302 designates the outline of a mounted part. Mounted parts at which faulty soldered locations do not exist are indicated in white on the inner side of the outline 302, whereas mounted parts at which faulty soldered locations do exist are indicated in black on the inner side of the outline 302. Further, the type of soldering defect, such as an excessive or insufficient amount of solder, regarding each faulty soldered location appears at suitable locations on the recording paper 300.

The recording paper 300 is sent to a soldering-defect correction line together with the relevant printed circuit board. While observing the recording paper 300, a worker manually corrects the faulty soldered locations using a soldering iron.

However, correcting a faulty soldered location by a manual operation places a great burden upon the worker. Even if inspection of soldering is automated using an automatic inspection apparatus, human intervention is needed to correct the faulty soldered location. This places a limit upon the improvement that can be made in the overall operating efficiency of the part mounting operation and upon streamlining of the operation.

In order to solve this problem, the development of apparatus for automatically correcting soldering defects has made progress in recent years. This apparatus is capable of correctly faulty soldered locations automatically.

In such apparatus for automatically correcting soldering defects, it is required that the automatic correction apparatus be taught information, which is required to correct faulty soldered locations, before the correcting operation, this information being position information indicating the faulty soldered locations and information relating to correction conditions needed to correct the faulty soldered locations. This operation generally is referred to as "teaching". The correction conditions generally differ for each part. The information relating to the correction conditions includes such information as the soldering-iron approach angles relative to a soldering location, the amount of solder supplied and heating time, etc.

However, entering the above-mentioned correction condition information with regard to all printed circuit boards and all parts that are the object of soldering correction requires a great amount of time and labor, and the apparatus for automatically correcting soldering defects cannot be operated during the teaching operation.

DISCLOSURE OF THE INVENTION

An object of the present invention is to provide a teaching apparatus and method whereby an automatic soldering apparatus can be taught soldering condition information efficiently.

Another object of the present invention is to provide a soldering inspection apparatus and method whereby correction condition information needed to correct a faulty soldered location can be supplied efficiently to an apparatus for automatically correcting soldering defects.

A further object of the present invention is to provide an apparatus and method for automatically correcting soldering defects, in which correction condition information needed to correct a faulty soldered location can be entered in an efficient manner.

According to a first aspect, a teaching apparatus for an automatic soldering apparatus in accordance with the present invention comprises first memory means in which soldering condition information is stored in advance for each classification of parts, second memory means in which identification codes of parts, which are to be mounted on a board, are stored in advance for each board, third memory means in which a corresponding relationship between the identification codes of the parts and part classifications to which the parts belong is stored in advance, input means for entering an identification code of a board, and means which, with regard to a board whose identification code has been entered by the input means, is for reading all parts, which are to be mounted on the board, from the second memory means, reading soldering condition information suited to the read parts from the first memory means upon referring to the corresponding relationship stored in the third memory means, and creating a soldering-condition teach-data table indicating the correlation among the board, the parts to be mounted on the board and the soldering condition information suited to the parts.

According to a second aspect, an automatic soldering apparatus in accordance with the present invention comprises first memory means in which soldering condition information is stored in advance in correspondence with parts, second memory means in which information relating to parts to be mounted on a board is stored in advance for each board, input means for entering an identification code of a board, and means which, with regard to a board whose identification code has been entered by the input means, is for reading all parts, which are to be mounted on the board, from the second memory means, reading soldering condition information suited to the read parts from the first memory means, and creating a soldering-condition teach-data table indicating correlation among the board, the parts to be mounted on the board and the soldering condition information suited to the parts.

According to a third aspect, a method of teaching an automatic soldering apparatus in accordance with the present invention comprises the steps of storing soldering condition information in first memory means in advance for each classification of parts, storing identification codes of parts, which are to be mounted on a board, in second memory means in advance for each board, entering an identification code of a board, and, with regard to a board whose identification code has been entered, reading all parts, which are to be mounted on the board, from the second memory means, reading soldering condition information of classifications to which the read parts belong from the first memory means, and storing the read parts and the read soldering condition information in correlated form in a soldering-condition teach-data table.

In an embodiment of this teaching method, steps include displaying parts read from the second means on a display unit, displaying classifications of parts stored in the first memory means on the display unit, entering from an input unit a classification to which the displayed parts belong from among the displayed classifications of parts, and reading soldering condition information that corresponds to the entered part classification from the first memory means and correlating this information with the parts displayed.

In another embodiment of this teaching method, steps include storing a corresponding relationship between identification codes of parts and part classifications to which these parts belong in third memory means in advance, discriminating, by referring to the corresponding relationship in the third memory means, a part classification to which a part read out of the second memory means belongs, and reading soldering condition information that corresponds to the discriminated part classification from the first memory means and correlating the information with the read part.

In accordance with the automatic soldering apparatus, the apparatus for teaching the same and the teaching method according to the present invention, soldering condition information necessary for automatic soldering is stored in the first memory means in advance for each part or each classification. When soldering condition information is taught, the soldering condition information corresponding to each part on the board is selected and read out of the first memory means and taught to the automatic soldering apparatus. As a result, there is a great reduction in the labor and time required for teaching.

According to a fourth aspect, a soldering inspection apparatus according to the present invention comprises inspecting means for discriminating soldering quality and positions of parts mounted on a board, first memory means for storing the parts, which have been mounted on the board, in advance, second memory means in which correction condition information necessary for correcting faulty soldered locations is stored in advance for each classification of parts, and means which, when a soldering defect of a part has been detected by the inspecting means, is for reading correction condition information that corresponds to a classification to which the part belongs from the second memory means, and creating correction data by correlating position information representing the location at which the soldering defect has been discriminated and the read correction condition information.

A soldering inspection method according to the present invention comprises the steps of storing parts, which have been mounted on a board, in first memory means in advance, storing correction condition information necessary for correcting a faulty soldered location in second memory means in advance for each classification of parts, discriminating soldering quality and positions of the parts mounted on the board, and, when a soldering defect of a part has been detected, reading correction condition information, which corresponds to a classification to which the part belongs, from the second memory means and creating correction data by correlating position information representing the location at which the soldering defect has been discriminated and the read correction condition information.

In an embodiment of the soldering inspection apparatus and method according to the fourth aspect, when a soldering defect of a part has been detected by the inspecting means, the detected part is displayed on display means. The classification to which the displayed part belongs is entered from input means. Correction condition information corresponding to the classification entered from the input means is read from the second memory means and is correlated with the detected part.

In another embodiment, a corresponding relationship between parts and classifications to which these parts belong is stored in third memory means in advance. Correction condition information corresponding to a part for which a soldering defect has been detected is correlated with the detected part by referring to the corresponding relationship stored in the third memory means.

The correction data created is stored in memory means or transmitted to an apparatus for automatically correcting soldering.

Furthermore, there is provided an apparatus for automatically correcting soldering, in which a faulty soldered location is corrected based upon the created correction data.

According to a fifth aspect, a soldering inspection apparatus according to the present invention comprises memory means in which parts mounted on a board, criteria data for discriminating soldering quality of the parts and correction condition information necessary for correcting faulty soldered locations relating to the parts are stored in advance in correlated form, inspecting means for discriminating soldering quality and positions of the parts, which have been mounted on the board, in accordance with the criteria data stored in the memory means, and means which, when a soldering defect of a part has been detected by the inspecting means, is for reading correction condition information that corresponds to the part from the memory means, and creating correction data by correlating position information representing a location at which the soldering defect has been discriminated and the read correction condition information.

A soldering inspection method according to the present invention comprises the steps of storing, in memory means in advance and in correlated form, parts mounted on a board, criteria data for discriminating soldering quality of the parts and correction condition information necessary for correcting faulty soldered locations relating to the parts, discriminating soldering quality and positions of the parts mounted on the board in accordance with the criteria data stored in the memory means, and, when a soldering defect of a part has been detected, reading correction condition information that corresponds to the part from the memory means, and creating correction data by correlating position information representing a location at which the soldering defect has been discriminated and the read correction condition information.

In the soldering inspection apparatus and method according to the fifth aspect as well, correction data created is stored in memory means or transmitted to an apparatus for automatically correcting soldering.

Furthermore, there is provided an apparatus for automatically correcting soldering, in which a faulty soldered location is corrected based upon the created correction data.

According to a sixth aspect, a soldering inspection apparatus according to the present invention comprises inspecting means for discriminating soldering quality and positions of parts mounted on a board, memory means in which parts mounted on the board and correction condition information necessary for correcting faulty soldered locations relating to the parts are stored in advance in correlated form, and means which, when a soldering defect of a part has been detected by the inspecting means, is for reading correction condition information that corresponds to the part from the memory means, and creating correction data by correlating position information representing a location at which the soldering defect has been discriminated and the read correction condition information.

A soldering inspection method according to the present invention comprises the steps of storing, in memory means in advance and in correlated form, parts mounted on a board and correction condition information necessary for correcting faulty soldered locations relating to the parts, discriminating soldering quality and positions of the parts mounted on the board, and, when a soldering defect of a part has been detected, reading correction condition information that corresponds to the part from the memory means, and creating correction data by correlating position information representing a location at which the soldering defect has been discriminated and the read correction condition information.

In accordance with the soldering inspection apparatus and method according to the fourth, fifth and sixth aspects, correction condition information necessary for correcting a faulty soldered location is stored in memory means beforehand. When a faulty location is found in automatic inspection of soldering, correction condition information corresponding to the part having this faulty location is read out of the memory means and correction data is obtained in which the correction condition information read and position information of the faulty location are correlated. Since the correction data can be utilized as is in an apparatus for automatically correcting soldering defects, the labor and time needed to teach the correction apparatus can be greatly reduced.

According to a seventh aspect, an automatic soldering correction apparatus in accordance with the present invention comprises first memory means in which correction condition information necessary for correcting faulty soldered locations is stored in advance for each classification of parts, second memory means in which mounted parts on a board on which parts are mounted are stored, third memory means in which a corresponding relationship between the parts and part classifications to which the parts belong is stored in advance, and means for reading correction condition information suited to a mounted part on the board from the first memory means upon referring to the corresponding relationship stored in the third memory means, and creating a correction-condition information table in which the parts and correction condition information corresponding thereto are correlated.

In an embodiment, the apparatus for automatically correcting soldering further comprises inspection-result input means for entering position information of a faulty soldered location with regard to a part having a faulty soldered location on the board on which the part is mounted, and soldering correcting means for reading correction condition information, which corresponds to the part having the faulty soldered location for which the position information has been entered by the inspection-result input means, from the correction-condition information table, and executing a soldering correction operation of the faulty soldered location of the mounted part on the board in accordance with the read correction condition information.

The inspection-result input means is realized by means for reading inspection results from fourth memory means in which the inspection results have been stored in advance, or means for receiving the inspection results transmitted thereto.

According to an eighth aspect, an automatic soldering correction apparatus in accordance with the present invention comprises first memory means in which correction condition information necessary for correcting faulty soldered locations is stored in advance for each classification of parts, second memory means in which a corresponding relationship between parts and part classifications to which the parts belong is stored in advance, inspection-result input means for entering position information of a faulty soldered location with regard to a part having a faulty soldered location on a board on which the part is mounted, and soldering correcting means for reading correction condition information, which corresponds to the part having the faulty soldered location for which the position information has been entered by the inspection-result input means, from the first memory means upon referring to the corresponding relationship stored in the second memory means, and executing a soldering correction operation of the faulty soldered location of the mounted part on the board in accordance with the read correction condition information.

The inspection-result input means is realized by means for reading inspection results from third memory means in which the inspection results have been stored in advance, or means for receiving the inspection results transmitted thereto.

According to a ninth aspect, an automatic soldering correction method in accordance with the present invention comprises the steps of storing correction condition information necessary for correcting faulty soldered locations in first memory means in advance for each classification of parts, storing mounted parts mounted on a board in second memory means in advance, displaying the mounted parts, which have been stored in the second memory means, on a display unit, entering a part classification to which the displayed mounted parts belong, reading correction condition information, which corresponds to the entered part classification, from the first memory means, creating a correction-condition information table in which the displayed parts and read correction condition information are correlated, giving a part having a faulty soldered location on a board on which the parts has been mounted, as well as position information of the faulty location, reading correction condition information, which corresponds to the given part having the faulty location, from the correction-condition information table, and executing a soldering correction operation of the faulty location in accordance with the read correction condition information.

According to a tenth aspect, an automatic soldering correction method in accordance with the present invention comprises the steps of storing correction condition information necessary for correcting faulty soldered locations in memory means in advance for each classification of a part, giving a part having a faulty soldered location on a board on which the parts has been mounted and position information of the faulty location, reading correction condition information, which corresponds to the given part having the faulty location, from the memory means, and executing a soldering correction operation of the faulty location in accordance with the read correction condition information.

According to an 11th aspect, an automatic soldering correction apparatus in accordance with the present invention comprises first memory means in which correction condition information necessary for correcting faulty soldered locations is stored in advance in correspondence with parts, second memory means in which information relating to mounted parts on a board on which the parts have been mounted is stored, means for reading correction condition information suited to a mounted part on the board from the first memory means and creating a correction-condition information table in which the parts on the board and correction condition information corresponding thereto are correlated, inspection-result input means for entering position information of a faulty soldered location with regard to a part having a faulty soldered location on the board on which the part is mounted, and soldering correcting means for reading correction condition information, which corresponds to the part having the faulty soldered location for which the position information has been entered by the inspection-result input means, from the correction-condition information table, and executing a soldering correction operation of the faulty soldered location of the mounted part on the board in accordance with the read correction condition information.

According to an 12th aspect, an automatic soldering correction apparatus in accordance with the present invention comprises first memory means in which correction condition information necessary for correcting faulty soldered locations is stored in advance in correspondence with parts, inspection-result input means for entering position information of a faulty soldered location with regard to a part having a faulty soldered location on the board on which the part is mounted, and soldering correcting means for reading correction condition information, which corresponds to the part having the faulty soldered location for which the position information has been entered by the inspection-result input means, from the memory means, and executing a soldering correction operation of the faulty soldered location of the mounted part on the board in accordance with the read correction condition information.

In accordance with the automatic soldering correction apparatus and method of the present invention, automatic correction of a faulty soldered location is performed using position information regarding a faulty soldered location obtained by a soldering inspection as well as correction condition information stored in advance. As a result, correction of a faulty soldered location can be performed efficiently without human intervention. This not only reduces the operating burden on a worker but also improves overall operating efficiency greatly.

BRIEF DESCRIPTION OF THE DRAWINGS

FIG. 3 illustrates an example of a part classification table for soldering;

FIG. 8 illustrates an example of a teaching data table that has been created;

FIG. 15 illustrates the relationship between quality of soldered state and an image pattern obtained by image sensing;

FIG. 16 illustrates an example of a part classification table for inspection;

FIG. 17 illustrates an example of a part classification table for correction;

FIG. 21 shows an example of a criteria data file that has been created;

FIG. 22 illustrates an example of criteria data that has been created;

FIG. 27 shows an example of a table of correction condition information that has been created;

BEST MODE FOR CARRYING OUT THE INVENTION

First Embodiment

The first embodiment relates to an apparatus for and a method of teaching soldering condition information to an automatic soldering apparatus.

Figure 1:
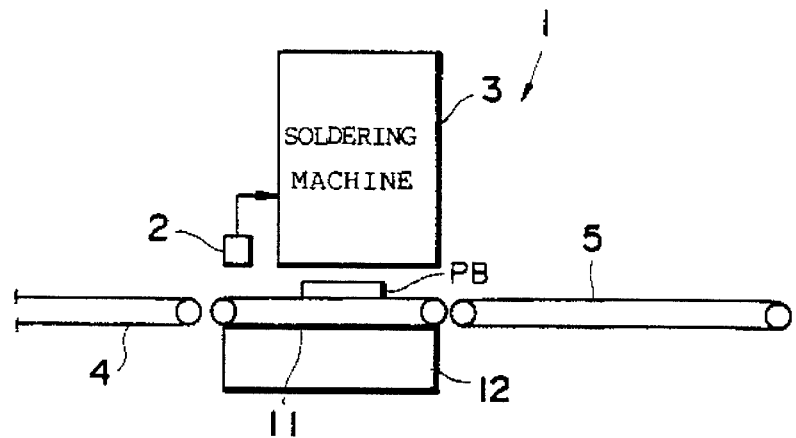
FIG. 1 illustrates the arrangement of an automatic soldering line provided with an automatic soldering apparatus.

FIG. 1 illustrates the arrangement of an automatic soldering line provided with an automatic soldering apparatus.

The automatic soldering line successively conveys boards PB, each of which carries a number of parts, in to an automatic soldering apparatus 1, solders each part on the board by means of the automatic soldering apparatus 1 and thereafter successively conveys the boards PB for which soldering has been completed from the automatic soldering apparatus 1.

A first conveyor 4 is for automatically conveying the board PB, which is supplied by a board supply mechanism (not shown) located upstream, to the automatic soldering apparatus 1. The trailing end of this conveyor leads to the leading end of a carry-in conveyor 11 of the automatic soldering apparatus 1. A second conveyor 5 is for carrying the board PB, which has undergone automatic soldering, out from the automatic soldering apparatus 1. The leading end of this conveyor leads to the trailing end of the carry-in conveyor 11.

The automatic soldering apparatus 1 comprises a soldering machine 3, an XY table 12 arranged below the soldering machine 3, and the carry-in conveyor 11 arranged above the XY table 12. An object sensor 2 such as a photoelectric sensor is arranged at a position on the board carry-in side of the carry-in conveyor 11. The object sensor 2 outputs an object-detection signal upon sensing the fact that the board PB has been carried in on the carry-in conveyor 11. The object-detection signal is applied to a control processor 20, described later, of the automatic soldering apparatus 1.

Figure 2:
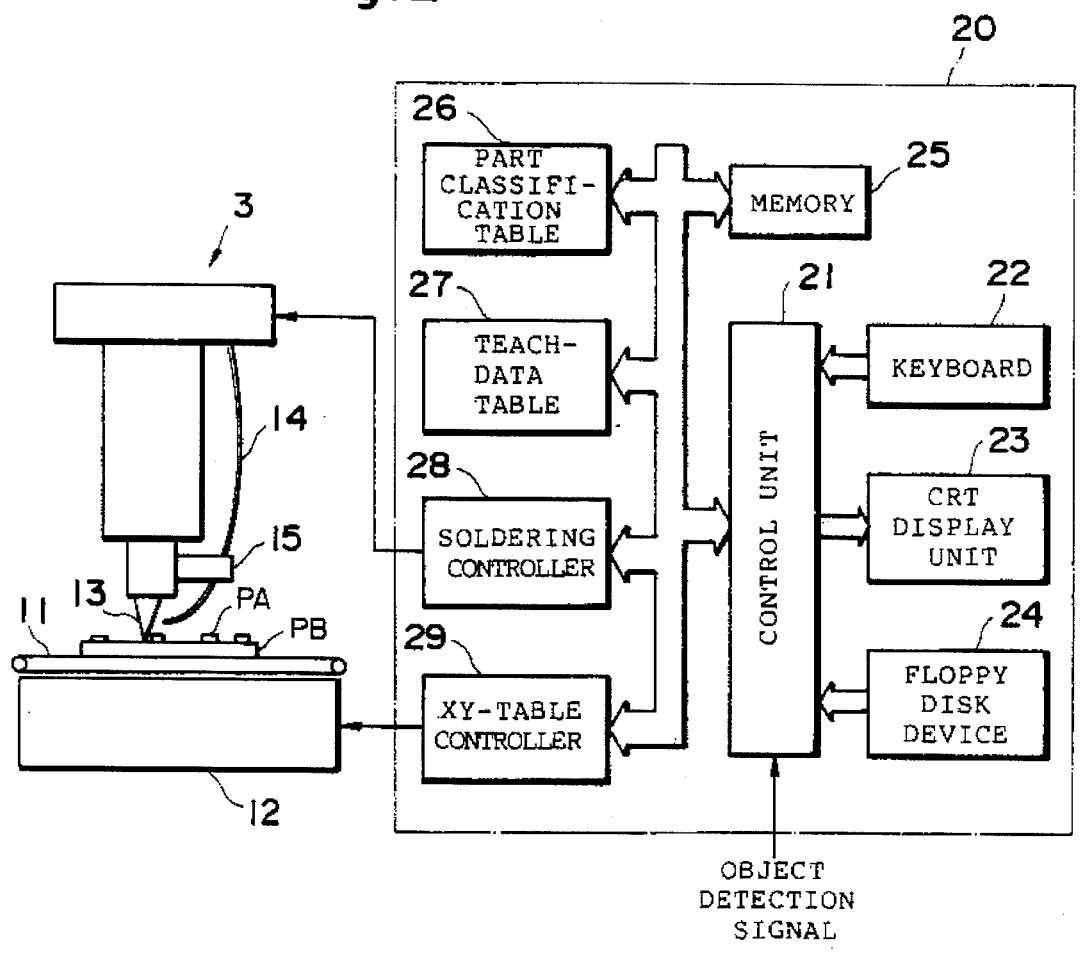
FIG. 2 illustrates the construction of the automatic soldering apparatus and the construction of a control processing unit peripheral thereto.

FIG. 2 illustrates the construction of the automatic soldering apparatus.

The soldering machine 3, which is for soldering a part PA placed at each part mounting position on the board PB conveyed in, has an automatic soldering iron 13, and a soldering-wire supply mechanism 15 for supplying soldering wire 14 to the position of the distal end of the automatic soldering iron 13. The XY table 12 is controlled to move in two perpendicularly intersecting directions in a horizontal plane so as to position a soldering location of the board PB at the automatic soldering iron 13.

The control processor 20 is electrically connected to the soldering machine 3.

The control processor 20 is constituted by a soldering controller 28, an XY-table controller 29, a controller (CPU) 21, a memory 25, a part classification table 26 for soldering purposes, a teach-data table 27, a keyboard 22, a CRT display unit 23 and a floppy disk device 24, etc.

On the basis of respective commands from the controller 21, the soldering controller 28 controls the operations of the automatic soldering iron 13 and soldering-wire supply mechanism 15 of the soldering machine 3, and the XY-table controller 29 controls the operation of the XY table 12.

The memory 25 includes a ROM and a RAM. A program is stored in the ROM, and the RAM is used as the work area of the controller 21. The keyboard 22 is used to enter various data, such as the name of the board supplied, and the CRT display unit 23 is used to display the input data from the keyboard 22 and the data of the part classification table 26 for soldering purposes. A floppy disk storing CAD data or the like obtained when a board is designed and manufactured is set in the floppy disk device 24. Information such as part mounting positions on the board PB to be soldered is read out of the floppy disk. It is also possible for this information to be entered using the keyboard 22.

The controller 21 includes a microprocessor or the like for reading data from and writing data to the memory 25 and floppy disk device 24 and controlling the operation of the input/output units (the keyboard 22, display unit 23 and controllers 28, 29, etc.).

As shown in FIG. 3, the part classification table 26 for soldering is a table in which soldering condition information necessary for soldering each part to a board is stored in advance for each part group, in which examples of the soldering condition information are the position and angle of the automatic soldering iron 13 relative to the soldering location, the amount of solder supplied and the heating time, etc.

Part types A~G in FIG. 3 indicate the types of parts, such as square chip, capacitor and QFP (quarter flag package), etc. Parts even of the same type may differ in terms of size, pin arrangement and pin number, and the soldering condition information for each of these parts also differs. Parts belonging to the same type are divided into a plurality of groups (for example, the parts belonging to part type A are divided into groups A1~A8) from the standpoint of whether the soldering condition information is the same or not. Parts belonging to the same part group have identical soldering condition information.

Figure 4:
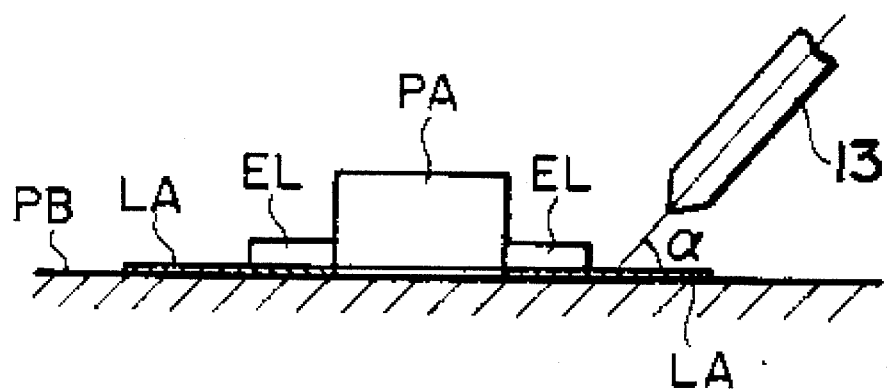
FIG. 4 is a side view for describing the angle of inclination of an automatic soldering iron.
Figure 5:
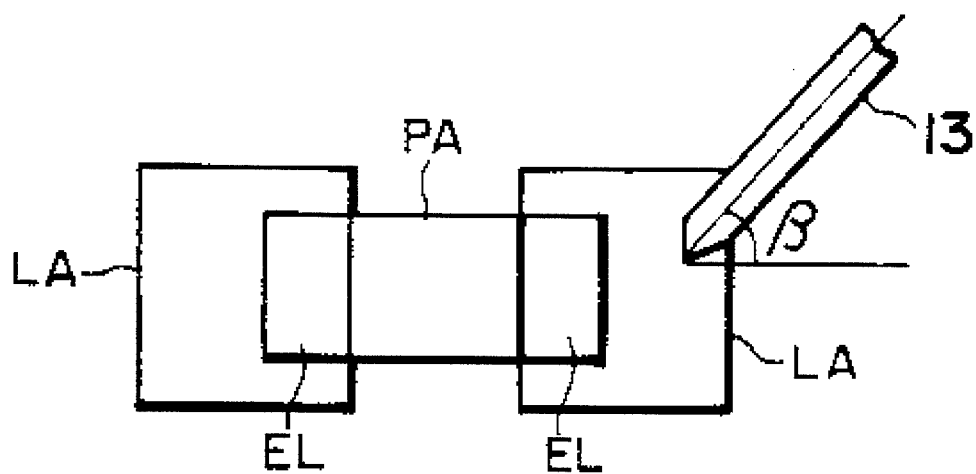
FIG. 5 is a plan view for describing the azimuth angle of an automatic soldering iron.

By way of example, the position of a soldering location refers to a position for which the center of the part is taken as the datum point. The angles of the automatic soldering iron 13 are an inclination angle α and an azimuth angle β. As illustrated in FIG. 4, the inclination angle α represents the vertical inclination of the automatic soldering iron 13 with respect to the surface of the board PB. As shown in FIG. 5, the azimuth angle β represents the horizontal inclination of the automatic soldering iron 13 with respect to the length direction of the part PA. In FIGS. 4 and 5, characters EL represent electrodes on both sides of the part PA, and characters LA represent lands provided at part mounting positions on the surface of the board PB. Solder is supplied to each land LA and the lands LA are soldered to the electrodes EL.

The teach-data table 27 stores, for each board, information needed for the soldering machine 3 to execute a soldering operation. The teach-data table is created in processing for teaching the soldering condition information. The details will be described later.

Figure 6:
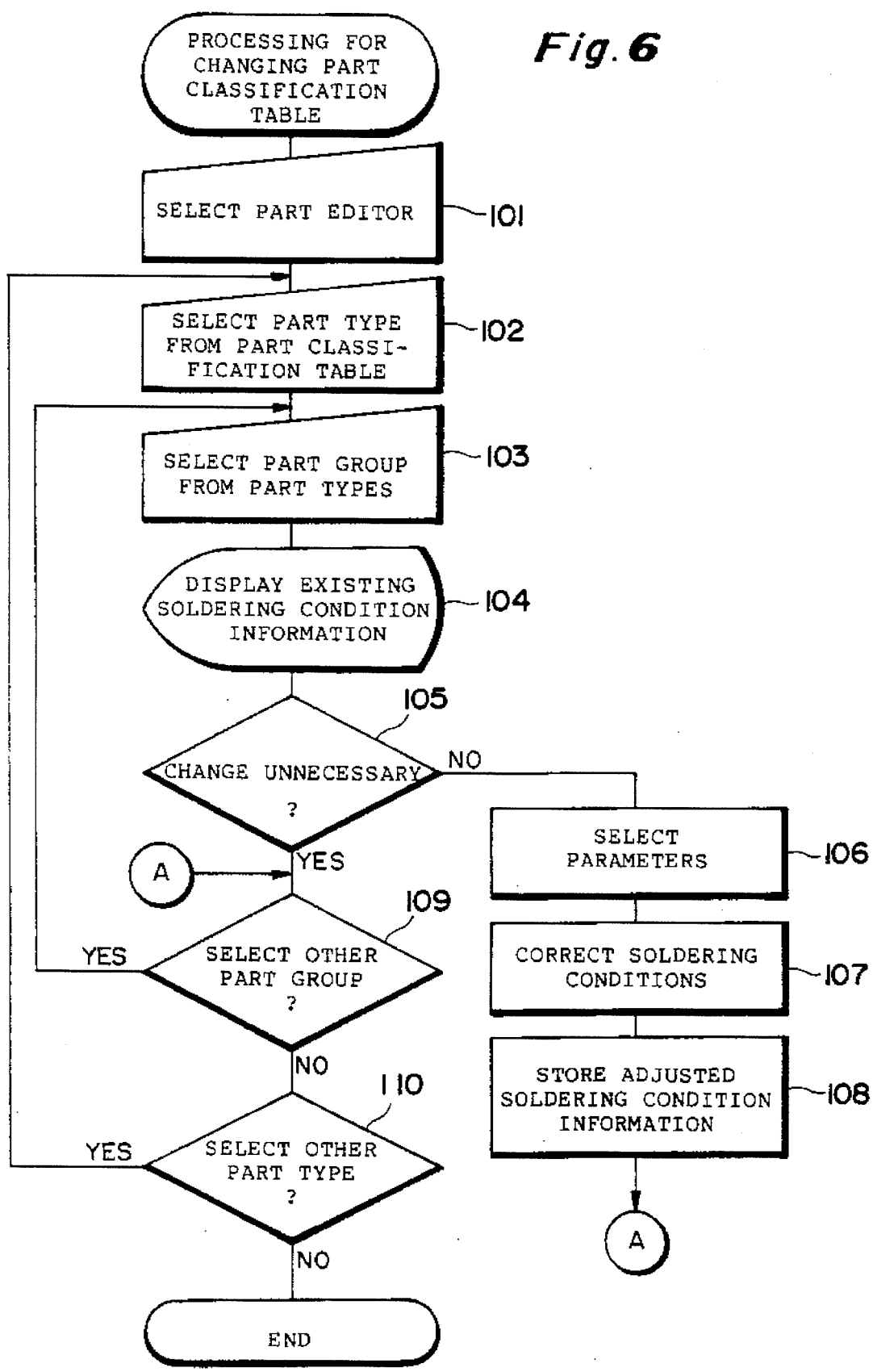
FIG. 6 is a flowchart illustrating a processing procedure for changing the part classification table for soldering.

FIG. 6 illustrates a processing procedure for revising or changing the part classification table 26 for soldering purposes.

First, prior to the start of processing, the controller 21 puts data processing conditions in order (initialization processing). The operator then manipulates the keyboard 22 to select a part editor (a program routine for revising the part classification table) (step 101), whereupon the contents (e.g., a list of part types and part groups) of the part classification table 26 for soldering, which have already been set in the automatic soldering apparatus 1, are displayed on the screen of the CRT display unit 23.

Next, with regard to a part whose soldering condition is to be confirmed, the operator selects the part type and the part group (steps 102, 103), whereupon soldering condition information regarding the selected type is read out of the part classification table for soldering and displayed on the screen of the CRT display unit 23 (step 104).

While observing the displayed soldering condition information, the operator judges whether it is necessary to revise or change the soldering conditions. This judgment is made based upon the degree of soldering of a part previously soldered.

When the operator has judged that it is necessary to change the soldering conditions, the operator makes an entry to this effect (NO at step 105) and enters the type of condition information to be changed (position, angle, amount of solder supplied or heating time: parameters) and the new soldering condition information corresponding to the entered type (steps 106, 107). The soldering condition information of the part group of the corresponding part type is updated using the new soldering condition information entered (step 108).

After the processing for changing the soldering condition information, or when it has been judged that the soldering conditions need not be changed, the operator selects the next part group to be executed and the part type and repeats the same processing (steps 109, 110).

Thus, the soldering part classification table is revised based upon experience and knowledge as derived from inspections of soldering carried out in the past, as a result of which the table is changed to one which is more appropriate.

When the part classification table for soldering is created anew, it will suffice to repeat the processing of steps 106~108 with regard to all part types and part groups.

Figure 7:
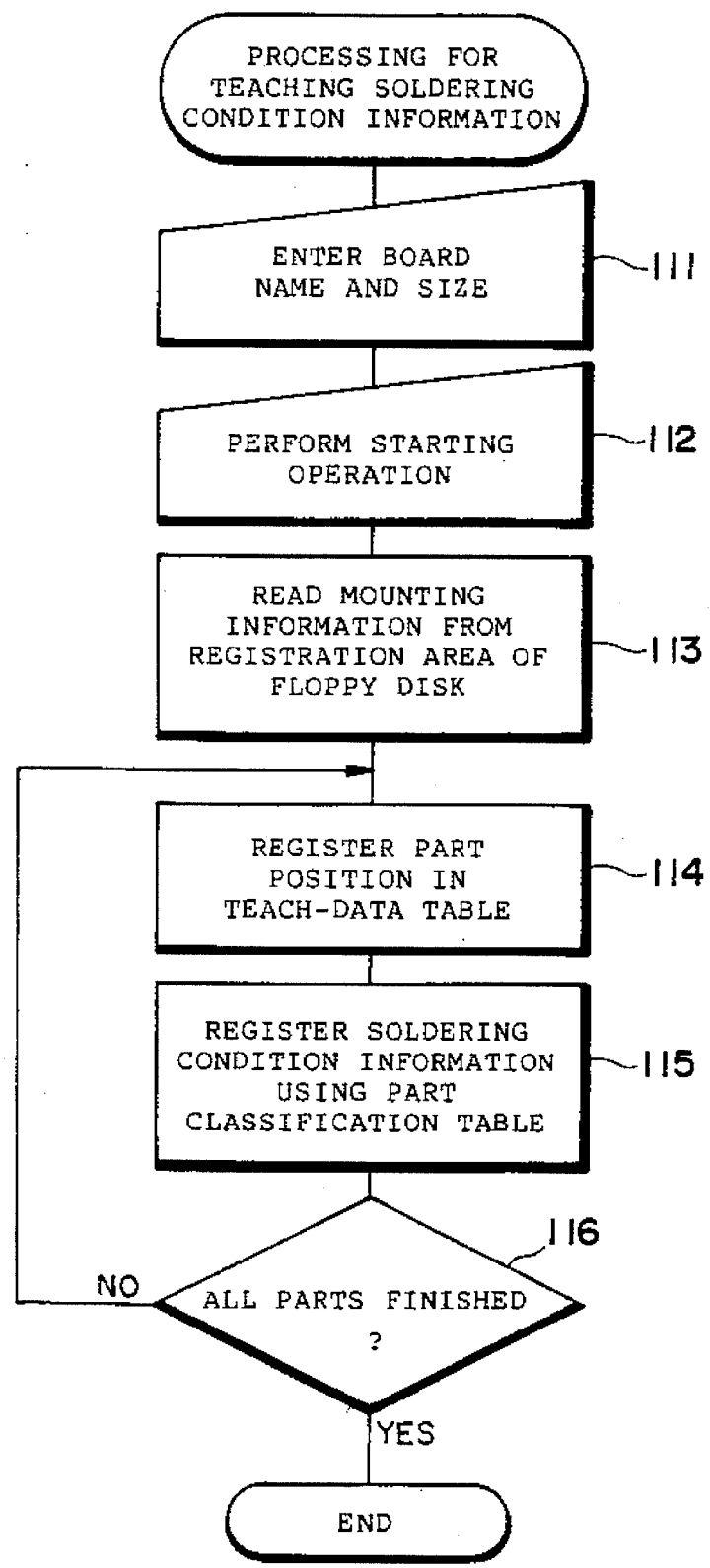
FIG. 7 is a flowchart illustrating a processing procedure for teaching soldering condition information.

FIG. 7 illustrates a processing procedure for teaching soldering condition information.

First, the operator manipulates the keyboard 22 to key in the board name (board ID) of the board that is the subject of the teaching operation as well as the size of the board (step 111).

In correspondence with board name (board ID), mounting information such as the name (or part NO) of the part to be mounted on the board, the part mounting position (position based upon the datum point of the board) and the mounting angle (widthwise or lengthwise) is stored beforehand, with regard to all parts to be mounted, in the floppy disk of the floppy disk device 24, as set forth earlier.

When the operator presses a start key (step 112), the floppy disk device 24 operates so that part mounting positions (and names of the parts if necessary), which have been written in a registration area in advance, are read from the registration area of the pertinent board name in the floppy disk and then registered in the teach-data table 27 (steps 113, 114).

As shown in FIG. 8, the teach-data table 27 stores, in correspondence with a board name, the positions of parts mounted on the board (and names of the parts if necessary) and soldering condition information regarding these parts, this being done for all mounted parts.

Next, the operator causes the contents of the part classification table 26 for soldering to be displayed on the screen of the CRT display unit 23 and selects, from the part classification table 26 that has been displayed, part groups to which the parts mounted on the board belong. When this is done, the soldering condition information of the selected part groups is read out of the part classification table 26 and registered in the teach-data table 27 in correspondence with the parts (step 115).

More specifically, the name of a part to be mounted on a designated board is read out of a floppy disk and displayed on the display unit 23. The operator observes the display part name and, on the basis of his own knowledge, or upon referring to a correspondence table created in advance, determines to which part type, and to which part group thereof in the part classification table for soldering, the part belongs. If the particular part group of a particular part type is known, then the operator is capable of designating the part type and part group in the part classification table for soldering. The soldering condition information of the designated part type and part group is registered in the teach-data table in correspondence with part name displayed earlier (in corresponding with the position information of this part).

The operation and processing of steps 114, 115 are repeated with regard to all parts to be mounted on the designated board (step 116).

It is also possible to adopt an arrangement in which a part number table (a part name vs. part group correspondence table), in which part names are correlated with part types and part groups of the parts, is created in advance, and the processing of steps 114, 115 is executed automatically, without operator intervention, while reference is made to this table.

The teach-data table 27 is created for all types of boards (board names) to undergo soldering.

Figure 9:
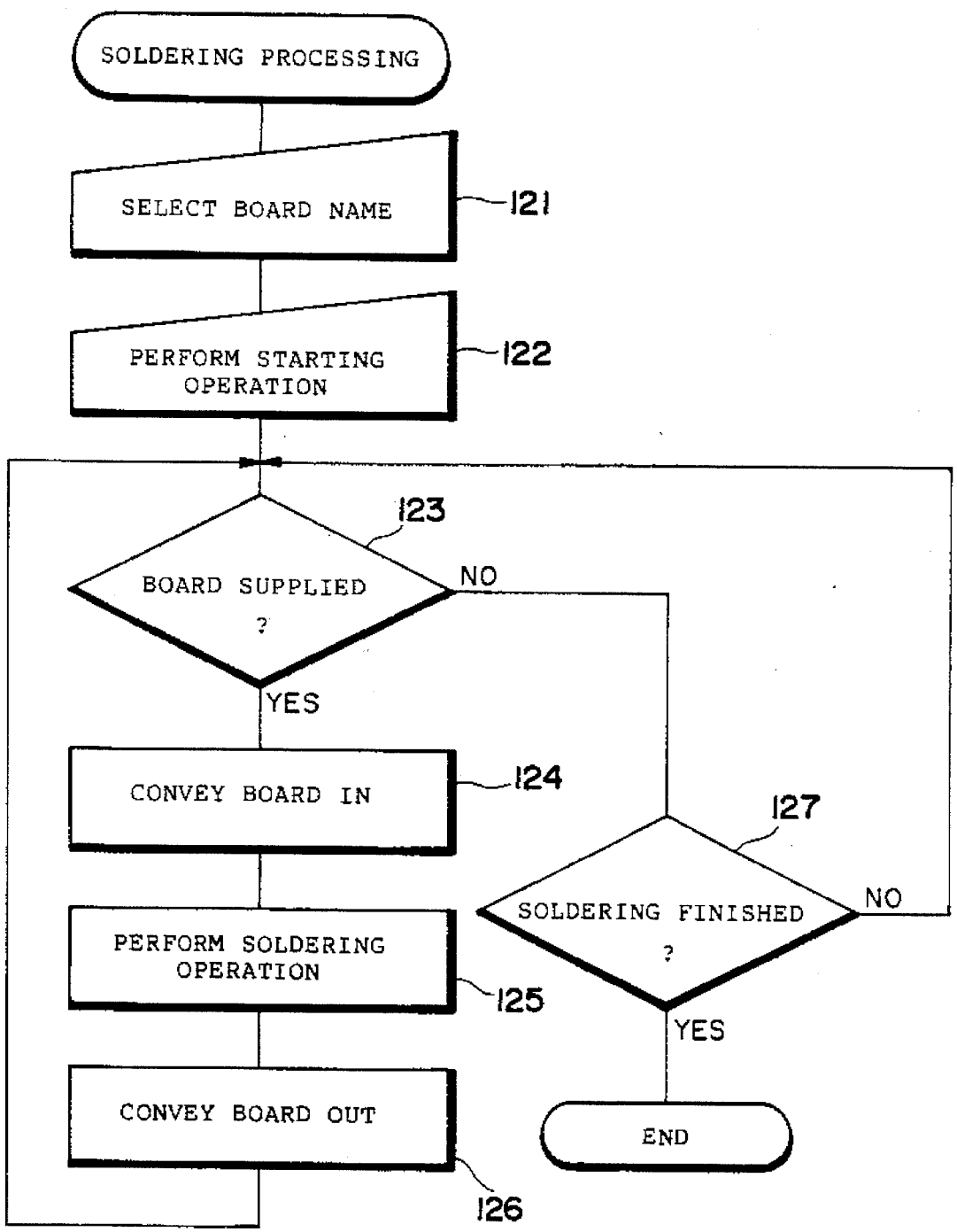
FIG. 9 is a flowchart showing a procedure for controlling soldering processing.

FIG. 9 shows the procedure of automatic soldering processing.

Using the keyboard 22, the operator enters the name of a board to undergo soldering and then presses the start key, thereby performing a starting operation (steps 121, 122).

Whether or not the board PB has been supplied to the automatic soldering apparatus 1 is checked (step 123). When the board PB is fed in on the carry-in conveyor 11, this is sensed by the object sensor 2 (YES at step 123). As a result, the carry-in conveyor 11 operates and the board PB is brought to a predetermined position (step 124).

The controller 21 moves the XY table 12 via the XY-table controller 29 to position the soldering location of the first part PA at the soldering work position and subsequently controls the soldering-wire supply mechanism 15 via the soldering controller 28 in accordance with the indication of the teach-data table 27, thereby paying out a necessary amount of the soldering wire 14 to the soldering location so that soldering is performed (step 125). The positioning of the soldering location of part PA is carried out based upon the part position and information relating to the soldering position in the teach-data table 27. Further, the soldering machine 3 operates the automatic soldering iron 13 so as to satisfy the soldering condition information in the teach-data table 27, namely the inclination angle and azimuth angle of the automatic soldering iron 13, the amount of solder supplied and heating time, etc.

When the automatic soldering operation is applied to all soldering locations of all parts PA on the board PB, the carry-in conveyor 11 and the second carry-in conveyor 5 operate so that the board PB whose soldering has been completed is conveyed out from the automatic soldering apparatus 1 (step 126).

When the soldering operation is repeatedly executed for all boards PB supplied and there are no longer any boards to be supplied, the soldering operation is concluded (step 127).

This embodiment applies the present invention to an automatic soldering apparatus having only an automatic soldering function. However, it goes without saying that the present invention is applicable also to an automatic soldering apparatus having an automatic soldering function, a soldered-location inspecting function and a soldering fault correcting function, as in the embodiment illustrated next.

Second Embodiment

The second embodiment relates to an apparatus and method for inspecting soldered locations and determining whether soldering is acceptable or not on a printed circuit board on which electronic parts have been mounted by soldering.

FIGS. 10, 11, 12 and 13 respectively illustrate examples of soldering inspection/correction lines each of which includes a soldering inspection apparatus and an automatic soldering correction apparatus which, with regard to a board that the soldering inspection apparatus has judged to have a faulty soldered location, corrects the faulty soldered location automatically.

Figure 10:
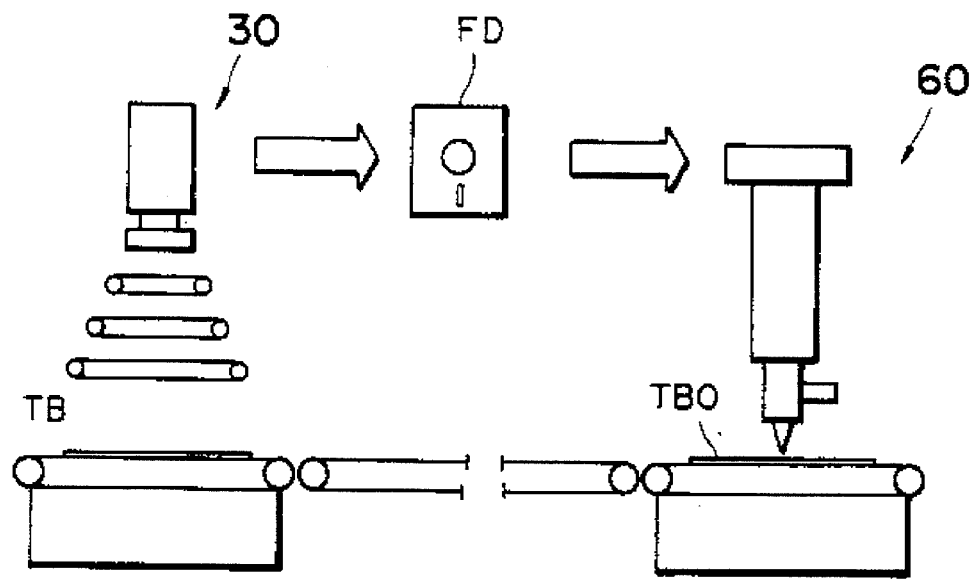
FIG. 10 illustrates the arrangement of a soldering inspection/correction line provided with a soldering inspection apparatus.

In the soldering inspection/correction line illustrated in FIG. 10, boards TB to be inspected and having a number of parts mounted thereon are successively carried in to a soldering inspection apparatus 30, where the soldered locations of each part are inspected with regard to each board TB undergoing inspection. As for a board on which a faulty soldered location exists, information obtained by attaching information relating to correction conditions, described later, to the position information indicting the faulty location is stored in the floppy disk FD. The floppy disk FD is supplied to an automatic soldering correction apparatus 60.

Boards TBO to be treated, namely boards on which faulty soldered locations exist, are successively carried in to the automatic soldering correction apparatus 60, where the faulty soldered locations are corrected automatically in accordance with the information read out of the floppy disk FD.

Figure 11:
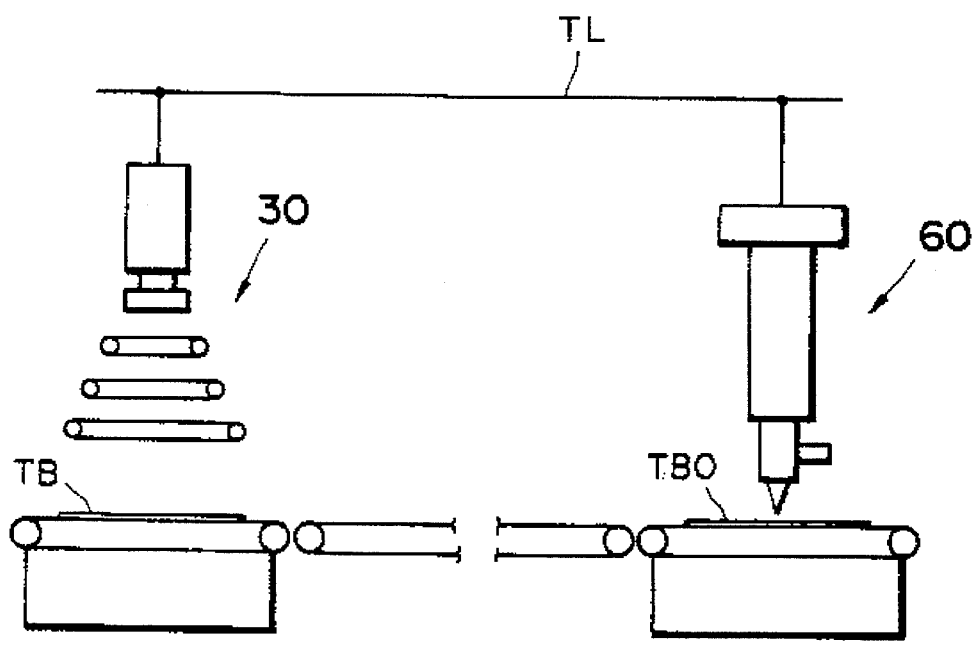
FIG. 11 illustrates another example of a soldering inspection/correction line provided with a soldering inspection apparatus.

In the soldering inspection/correction line illustrated in FIG. 11, the soldering inspection apparatus 30 and automatic soldering correction apparatus 60 are connected by a transmission line TL. Information relating to a soldering fault, which information is produced in the soldering inspection apparatus 30, is transmitted from the soldering inspection apparatus 30 to the automatic soldering correction apparatus 60 through the transmission line TL.

Figure 12:
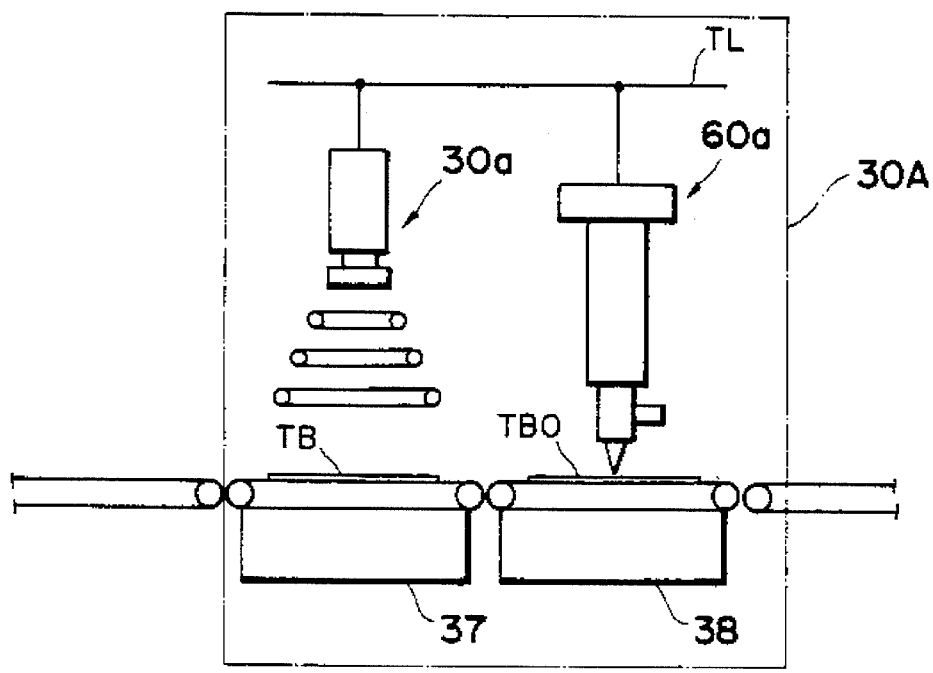
FIG. 12 illustrates another example of an arrangement of a soldering inspection apparatus.
Figure 13:
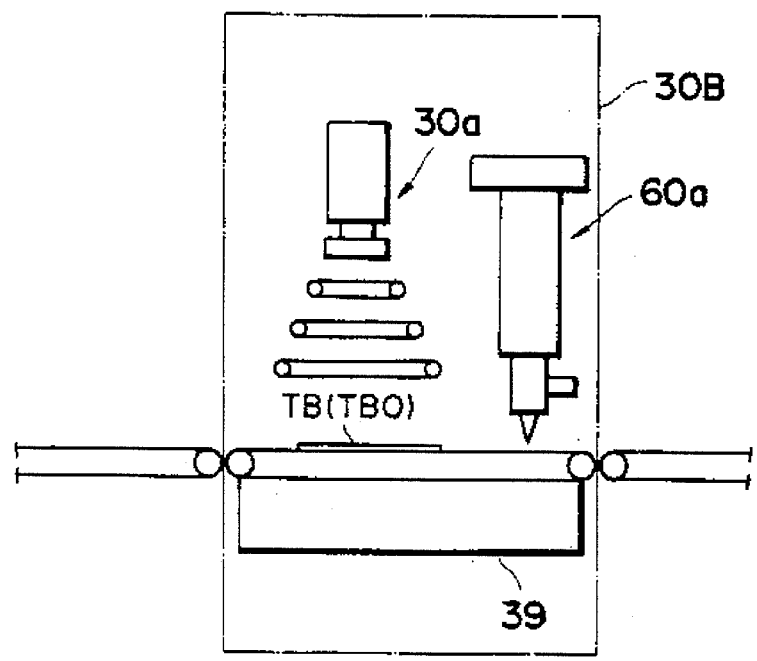
FIG. 13 illustrates yet another example of the arrangement of a soldering inspection apparatus.

In FIGS. 10 and 11 described above, the soldering inspection apparatus 30 and automatic soldering correction apparatus 60 are arranged as mutually independent apparatus. However, the soldering inspection function and automatic soldering correction function can also be incorporated in a single apparatus. As illustrated in FIG. 12 or FIG. 13, a soldering inspection apparatus 30A or 30B is internally provided with a soldering inspection unit 30a and an automatic soldering correction unit 60a so that the inspection of soldering and automatic correction of soldering are performed in the soldering inspection apparatus.

In the arrangement illustrated in FIG. 12, the soldering inspection unit 30a continuously inspects soldered locations of all parts on the board TB under inspection. At the end of inspection, the board TBO on which a faulty soldered location exists is delivered to the automatic soldering correction unit 60a, where the faulty soldered location is corrected. Since inspection of the soldered locations and automatic correction of faulty soldered locations are carried out separately, a table device 37 for supporting and positioning the board under inspection and a table device 38 for supporting and positioning the board TBO to be treated, namely the board undergoing correction, are provided separately and independently of each other.

In the arrangement shown in FIG. 13, the soldered locations of each part on the board TB under inspection are inspected successively by the soldering inspection unit 30a. When a faulty soldered location has been detected, the board TB is delivered to the automatic soldering correction unit 60a each time so that the soldered locations are corrected in successive fashion. Since inspection of soldering locations and correction of faulty soldered locations are carried out simultaneously and progressively, a table device 39 for supporting and positioning the board TB under inspection is shared by the soldering inspection unit 30a and automatic soldering correction unit 60a.

Figure 14:
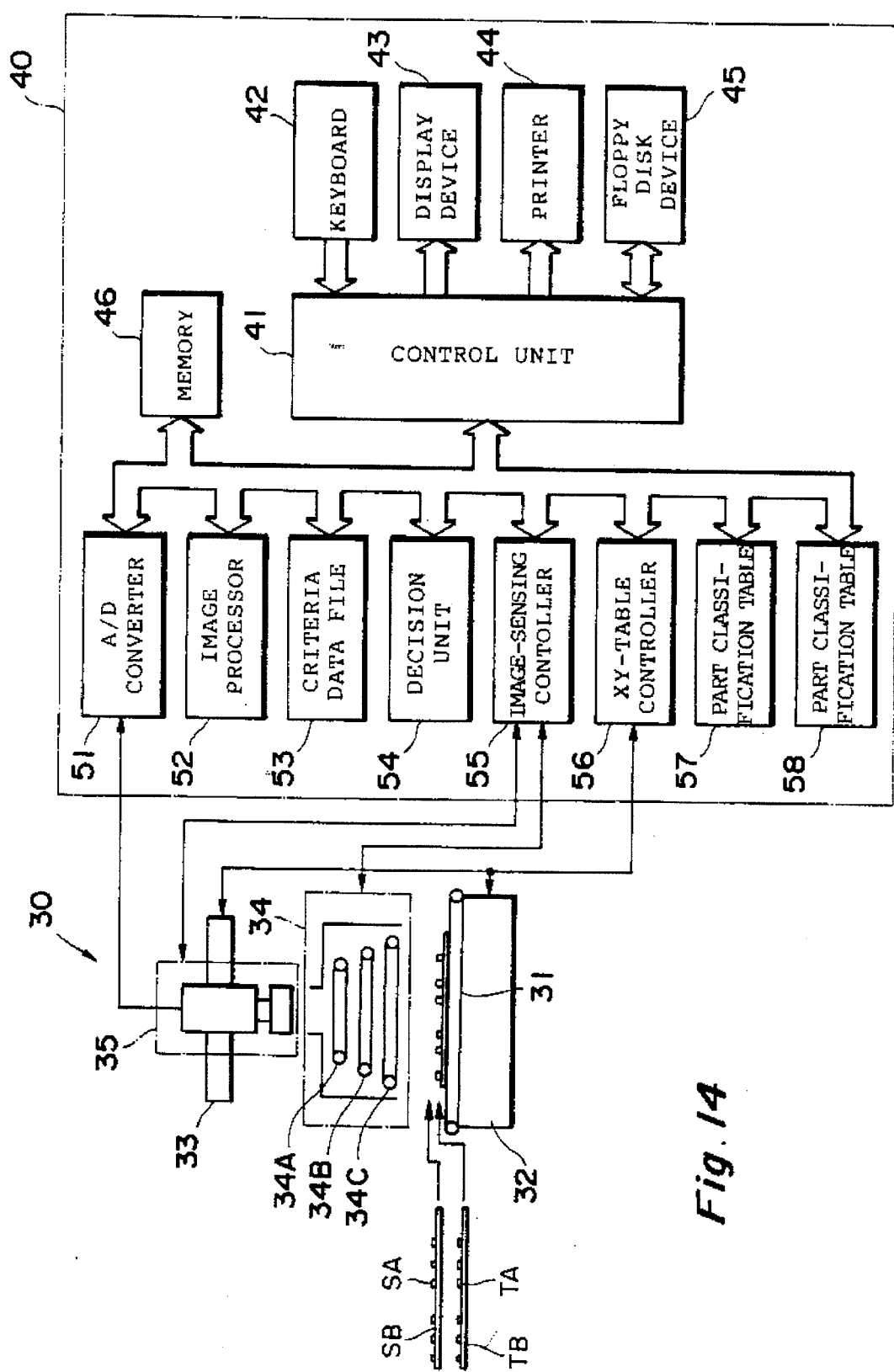
FIG. 14 illustrates the details of construction of a soldering inspection apparatus and the construction of a control processing unit thereof.

FIG. 14 illustrates the overall construction of the soldering inspection apparatus 30 provided in the soldering inspection/correction line depicted in FIG. 10.

The soldering inspection apparatus 30 is constituted by an X-axis table 33, a Y-axis table 32, a projector 34, a image sensing device 35 and a control processor 40. The soldering inspection apparatus 30 compares characteristic parameters, indicative of an inspection zone of each part SA on a reference board SB, obtained by imaging the reference board, and characteristic parameters, indicative of an inspection zone of each part TA on a reference board TB to be inspected, obtained by imaging the board TB to be inspected, and inspects the soldered state of each part TA.

The X-axis table 33 and Y-axis table 32 each have a motor (not shown) controlled by a control signal from the control processor 40. By driving the motors, the X-axis table 33 moves the image sensing device 35 in the X direction and the Y-axis table 32 moves a conveyor 31 supporting the board SB or TB in the Y direction.

The projector 34 includes three ring-shaped light sources 34A, 34B and 34C having different diameters. The ring-shaped light sources 34A, 34B, 34C emit red light, green light and blue light, respectively. Emission of the light having these different colors is performed simultaneously. The position at which a part on the board is observed via the image sensing device 35 is set to directly underlie the center of the ring-shaped light sources 34A–34C. Accordingly, light beams of different colors impinge upon the observed position from the ring-shaped light sources 34A–34C at different angles of incidence.

The ring-shaped light sources 34A, 34B, 34C can be realized by covering three white light sources with red-, green- and blue-colored filters, respectively, or by three ring-shaped color fluorescent lamps or neon tubes that generate red, green and blue light, respectively.

The three ring-shaped light sources 34A, 34B, 34C are so arranged as to emit light of the red spectrum, green spectrum and blue spectrum having light-emission energy distributions versus wavelength that result in white light when the emitted light beams mix. In addition, the quantity of light of each hue is adjusted by an image-sensing controller 55 in such a manner that the red, green and blue light emitted by the respective light sources 34A, 34B, 34C will mix to produce white light. As a result, it is possible to detect information (part number, polarity, color code, etc.) relating to the parts on the boards SB, TB under illumination by the projector 34, as well as pattern information (various marks, etc.).

A color video camera is used in the image sensing device 35 and is positioned so as to point down to the position directly above the observation position. Light reflected from the surface of the boards SB, TB under observation is sensed by the image sensing device 35 and converted into color signals R, G, B of the three primary colors. These signals are supplied to the control processor 40.

The control processor 40 comprises an A/D converter 51, an image processor 52, a criteria data table 53, a decision unit 54, the image-sensing controller 55, an XY table controller 56, a part classification table 57 for inspection, a part classification table 58 for correction, a keyboard 42, a display unit 43, a printer 44, a floppy disk device 45, a memory 46 and a control unit 41.

The A/D converter 51 converts the color video signals R, G, B outputted by the image sensing device 35 into digital image-data signals and applies these signals to the control unit 41. The memory 46 is equipped with a RAM and a ROM. The ROM is used for storing programs and the RAM is used as the working area of the control unit 41.

The image processor 52 subjects the image data supplied via the control unit 41 to image processing, creates the criteria data file 53 and the file of data to be inspected and supplies these files to the control unit 41 and decision unit 54. The criteria data file 53 and the file of data to be inspected will be described later.

The image-sensing controller 55, which is equipped with interfaces connected to the control unit 41 as well as to the projector 34 and image sensing device 35, performs control such as adjusting the light quantity of each of the light sources 34A–34C in projector 34 and the balance of the R, G, B signals in the image sensing device 35 based upon a control signal outputted by the control unit 41.

The XY-table controller 56, which has interfaces connected to the control unit 41 as well as to the X-axis table 33 and Y-axis table 32, controls the X-axis table 33 and Y-axis table 32 based upon a control output from the control unit 41.

The display device 43 displays image data, the results of inspection and key-entered data when these are supplied by the control unit 41. When supplied with the results of inspection from the control unit 41, the printer 44 prints out these results in a predetermined format.

The keyboard 42 has various keys necessary for entering data relating to operating functions, the reference board SB and the board TB to be inspected. The data entered by the keys is supplied to the control unit 41.

The control unit 41, which is composed of a microprocessor or the like, controls the operation of each component and circuit when processing for changing the part classification table for inspection, processing for changing the part classification table for correction, processing for creating the criteria data file and inspection processing is executed in the manner described later.

The floppy disk device 45 is for writing position information indicative of a faulty location and information relating to correction conditions in the floppy disk FD in correspondence with the identification number (board ID or board name) of a board, namely the inspected board TB on which a faulty soldered location exists. The floppy disk FD is inserted in the floppy disk device of the automatic soldering correction apparatus 60. The automatic soldering correction apparatus 60 automatically corrects a faulty soldered location in accordance with the information read out of the floppy disk FD.

As shown in FIG. 16, the part classification table 57 for inspection purposes stores, for each part group of a part type, image information necessary for inspecting mounted parts and information relating to criteria. The part types and part groups are classified from the viewpoint of soldering inspection. The classifications may be the same as, or partially or entirely different from, those in the part classification table for soldering purposes in the first embodiment or those in the part classification table for correction purposes, describe next.

More specifically, the part classification table 57 for inspection purposes is a table for storing, in advance for each part group of a part type, information relating to an image needed to inspect the soldering of a mounted part as well as the relevant criteria, information (shape, length, width, etc.) relating, by way of example, to lands on a board on which parts are soldered, information (shape, size, etc.) relating to a window set as an inspection zone, information (hue, lightness, etc.) relating to characteristic parameters representing the state of soldering on lands, and criteria for judging the quality of characteristic parameters.

As will be described later, these items of information are read out selectively in conformity with part type and part group when the criteria data file 53 is created. In this embodiment, information relating to an image is color-image information. From information concerning hue, lightness (overall lightness of all colors), lightness of each hue and saturation, the information required is used selectively. In a case where information relating to an image is monochromic image information, black-and-white gray-level information is used.

As shown in FIG. 17, the part classification table 58 for correction purposes stores correction condition information, which is information necessary for correcting a faulty soldered location, for each part group of each part type. The part types and part groups are classified from the viewpoint of automatic soldering correction. The correction condition information includes approach angles (inclination angle and azimuth angle) of the automatic soldering iron with respect to a soldering location, amount of solder supplied and heating time, etc. It is preferred that these items of correction condition information be stored upon being grouped by type of defect (insufficient solder, excessive solder, etc., as set forth later). When a faulty soldered location has been detected in inspection of soldered locations, these items of information are read out selectively in dependence upon part type to which the part belongs, part group and type of defect.

The gist of soldering inspection of the soldering inspection apparatus 30 is as follows: In a mode for creating the criteria data file, items of image information and criteria information of the part type and part group to which the part SA on the reference board SB belongs are selectively read from the previously created part classification table for inspection purposes, and sets the image information and criteria information, read out of part classification table for inspection purposes, with regard to the inspection zone of the part SA on the reference board SB conveyed in to the observation position, whereby the criteria data file is created.

In the inspection mode, red, green and blue hue patterns are detected and characteristic parameters are generated with regard to the inspection zone of the part TA on the board TB to be inspected, and these items of pattern data are used to create a file of data to be inspected. The data of the data file to be inspected is compared with the relevant data in the criteria data file created previously and, on the basis of the results of comparison, each part TA on the board TB under inspection is judged with regard to its soldering quality.

Soldering quality refers to soldering which is acceptable and soldering which is defective. Soldering defects are too little solder, too much solder and correction impossible (part missing).

In the inspection mode, the decision unit 54 compares the criteria data file supplied by the control unit 41 with the file of data to be inspected transferred from the image processor 52, judges the quality of the soldered state of each part TA on the board TB under inspection and informs the control unit 41 of the result of judgment.

FIG. 15 exemplifies, in the form of a table, the relationship between the cross-sectional form of solder in a case where soldering is acceptable, a case where a part is missing and a case where solder is insufficient, and an imaged pattern, red pattern, green pattern and blue pattern provided by the image sensing device 35 in each of the above-mentioned cases. Since a distinct difference appears between any of the hue patterns in dependence upon the soldered state, it is possible to judge whether a part is present and the quality of soldering (as well as the state thereof, i.e., whether solder is insufficient, excessive, etc.).

In the description given above, the part classification table 57 for inspection purposes and the part classification table 58 for correction purposes are separately provided. However, a part classification table in which these tables are unified can be used.

Further, information as relates to criteria needed to inspect mounted parts is read out of the part classification table 57 for inspection in order to crate the criteria data file. However, the criteria data file may be created by entering information as relates to criteria by operating keys or the like without using the part classification table 57.

Figure 18:
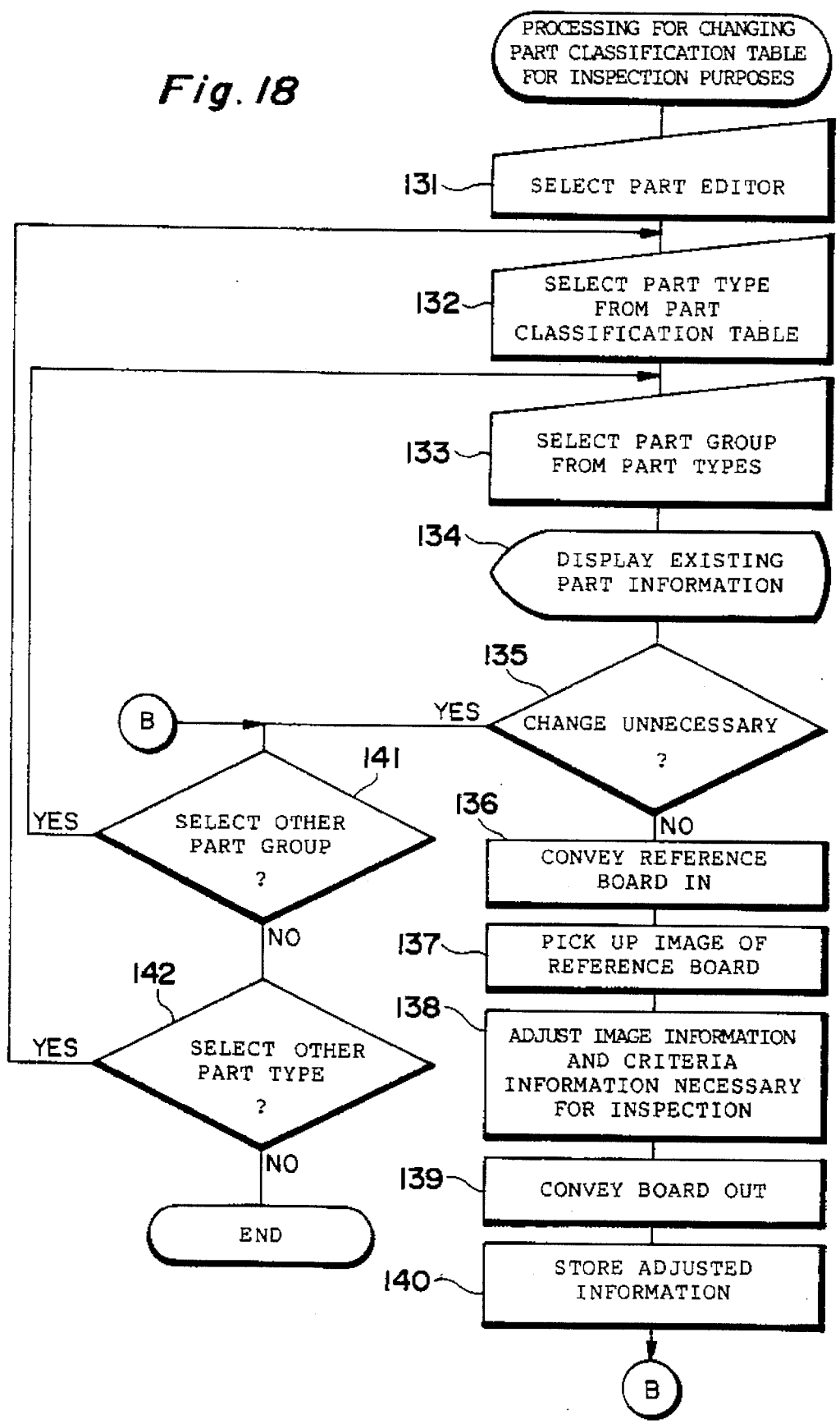
FIG. 18 is a flowchart illustrating a processing procedure for changing the part classification table for inspection.

FIG. 18 illustrates a processing procedure for changing the part classification table for inspection.

The control unit 41 controls the various components and circuits of the apparatus at the start of processing, thereby operating the projector 34 and image sensing device 35, and puts in order the imaging conditions and the data processing conditions (initialization processing). The operator manipulates the keyboard 42 to select a part editor (a routine for changing the part classification table for inspection purposes) (step 131), whereupon the contents of the part classification table 57 for inspection are displayed on the screen of the CRT display unit 43.

Next, the operator selects the part type and part group to which a part of interest belongs (steps 132, 133), whereupon existing image information and criteria information regarding the selected part is read out of the part classification table 57 for inspection purposes and displayed on the screen of the CRT display unit 43 (step 134).

When the operator has judged that it is unnecessary to change the displayed information (YES at step 135), processing shifts to selection of the next part type and part group (steps 141, 142).

When the operator has judged that the displayed information cannot be used for automatic inspection as is and therefore requires to be changed (NO at step 135), the reference board SB is conveyed in to the observation position of the soldering inspection apparatus 30 (step 136).

The relevant part SA on the reference board SB is imaged by the image sensing device 35 (step 137), the parameters relating to the sensed image are extracted and the values of these parameters are adjusted, whereby image information and the information relating to the relevant criteria desired to be registered in the part classification table for inspection is generated (step 138).

The parameters adjusted include information relating to part position and lands, information relating to a window necessary for bridge detection, information relating to characteristic parameters representing state of soldering, etc., on lands, and information relating to criteria for judging soldering quality of mounted parts.

When this adjustment ends, the reference board SB is conveyed out from the soldering inspection apparatus 30 (step 139). The newly adjusted information is registered in the part classification table 57 for inspection in correspondence with the part type and part group (step 140). The program then proceeds to step 141.

The correction processing described above is repeatedly executed for the required part types and part groups.

It is also possible to create the part classification table 57 anew in accordance with a procedure substantially the same as the processing procedure illustrated in FIG. 18.

Figure 19:
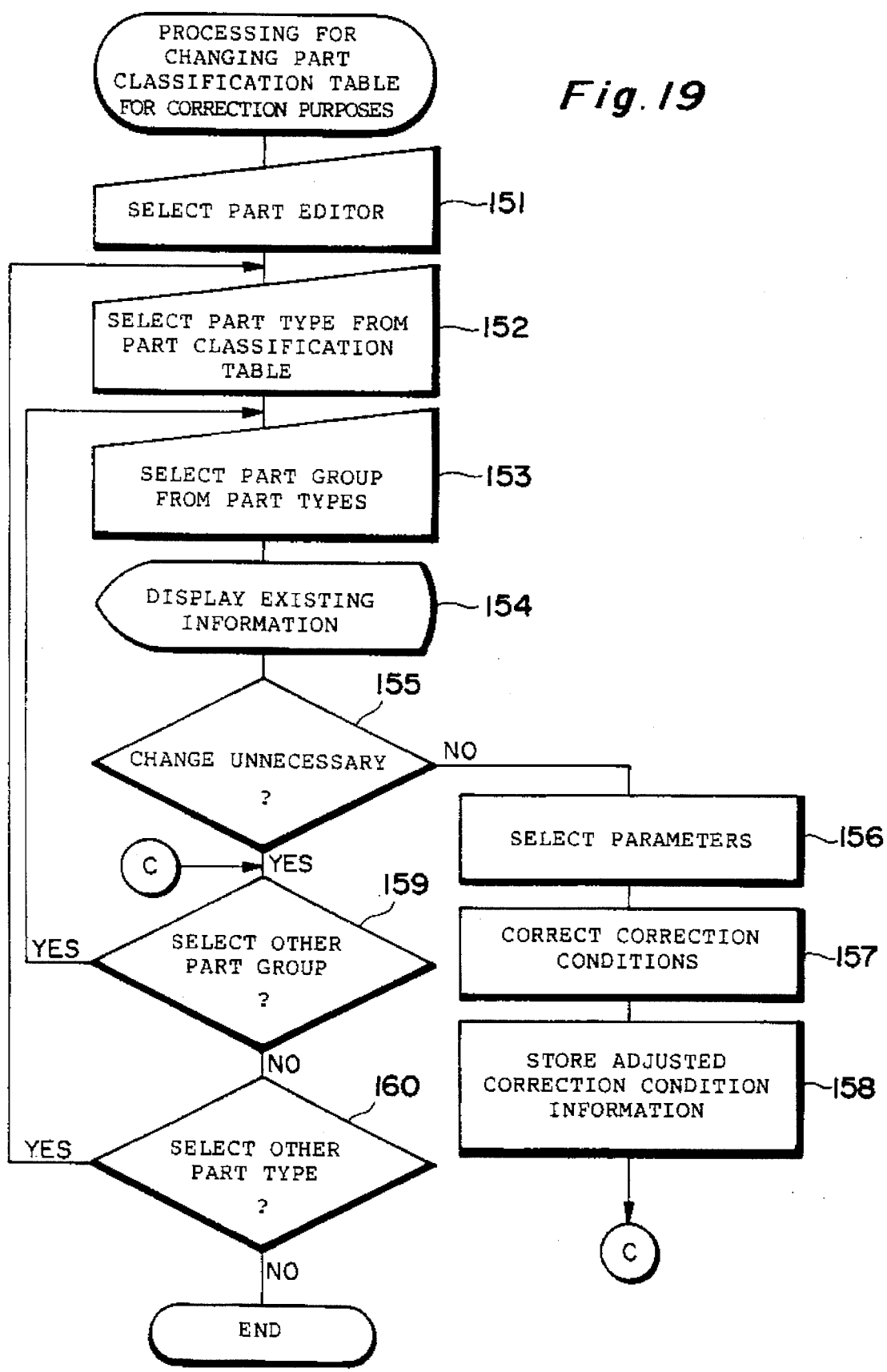
FIG. 19 is a flowchart illustrating a processing procedure for changing the part classification table for correction.

FIG. 19 illustrates a processing procedure for changing the part classification table for correction.

The operator manipulates the keyboard 42 to select a part editor for changing the part classification table for correction purposes (step 151), whereupon the contents of the part classification table 58 for correction are displayed on the screen of the CRT display unit 43.

Next, the operator selects the part type and part group to which a part of interest belongs (steps 152, 153), whereupon existing information relating to soldering correction conditions regarding the selected part and part group is displayed on the screen of the CRT display unit 43 (step 154).

If the displayed correction condition information need not be changed, then the program shifts to selection of the next part type and part group (steps 155, 159, 160).

When the operator has judged that it is necessary to change the displayed correction condition information (NO at step 155), one, two or more types (parameters) needing to be changed are selected from the correction condition information (step 156) and the relevant values are entered, whereby the correction condition information is changed on the display screen (step 157). The adjusted parameters and their values include various conditions for correcting the soldering of parts, namely the approach angles (inclination angle and azimuth angle) of the automatic soldering iron with respect to the soldering location, the amount of solder supplied and the heating time, etc., as mentioned above.

Thereafter, the changed correction condition information is registered in the part classification table 58 in correspondence with the relevant part type and part group (step 158).

It is also possible to create the part classification table 58 anew by a procedure the same as that illustrated in FIG. 18.

Figure 20:
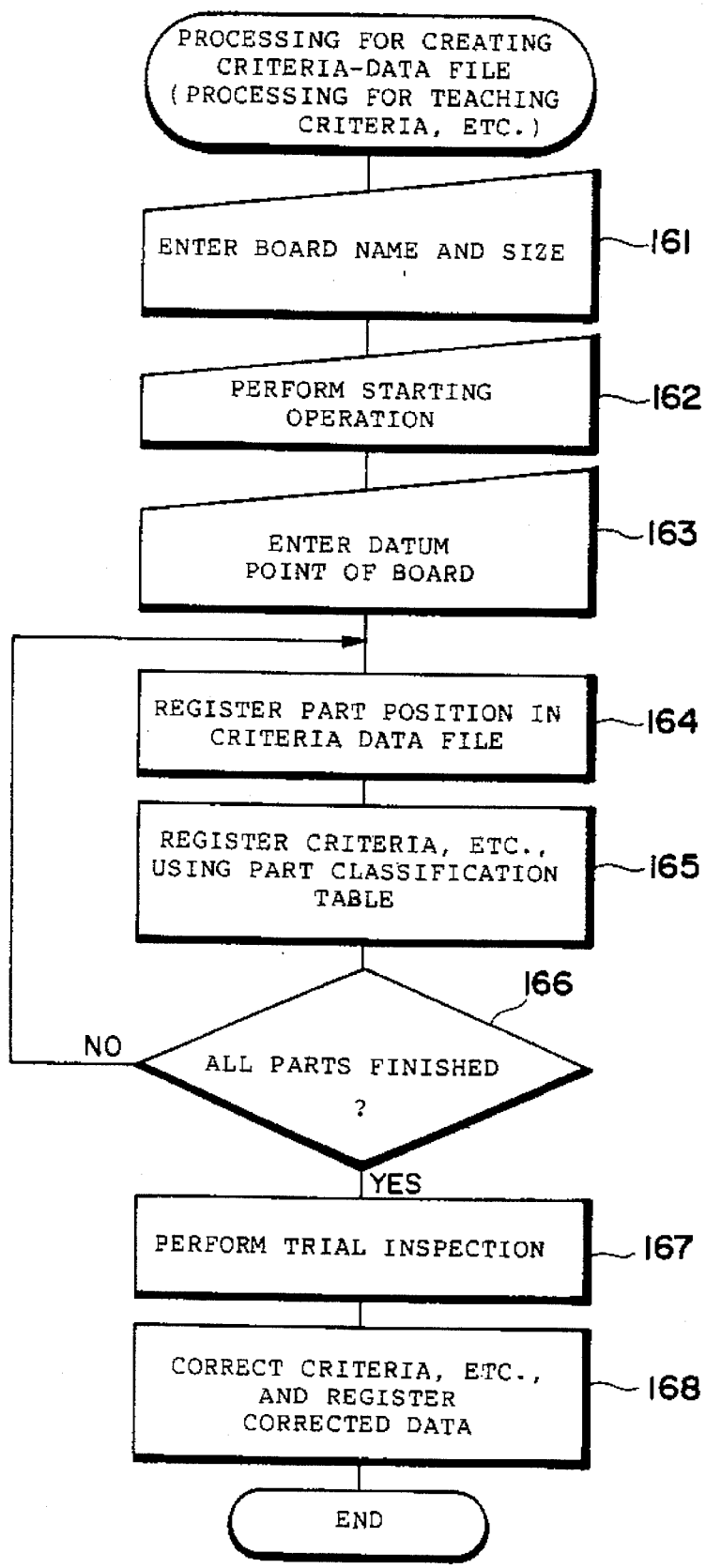
FIG. 20 is a flowchart illustrating a processing procedure for creating a criteria data file.

FIG. 20 illustrates a processing procedure for creating the criteria data file 53.

The operator manipulates the keyboard 42 to key in the board name (board ID) and board size of the board which is the subject of the teaching operation (step 161), after which the operator sets the reference board SB on the Y-axis table 32 and presses the start key (step 162).

The origin, upper right corner and lower left corner of the reference board SB are imaged by the image sensing device 35, and the size of the actual reference board SB is detected based upon the positions of these points. The control unit 41 positions the reference board SB at an initial position by controlling the X-axis table 33 and Y-axis table 32 on the basis of the size data detected (step 163).

The reference board SB is such that a prescribed reference part SA properly soldered at a part mounting position has an acceptable mounted quality. When the reference board SB is positioned at an initial position, the image sensing device 35 images the parts on the reference board SB. The position of each reference part SA on the reference board SB is measured by processing the image data obtained from this imaging, and the position data is stored in the criteria data file 53 as part positions (step 164).

Mounting information such as the names of parts mounted on boards, the mounting positions of the parts (positions for which the datum point of the board serves as a reference) and mounting angles (whether the part is arranged widthwise or lengthwise) is stored, with regard to all mounted parts, and in correspondence with the names of the boards (the board IDs), on a floppy disk on which CAD data used in designing and fabricating boards has been stored. As in the processing of step 113 in FIG. 7, an arrangement may be adopted in which the mounting position of each part is read out of a floppy disk and registered in the criteria data file 53 (i.e., in which the mounting position of each part is taught).

As illustrated in FIG. 21, the criteria data file 53 stores, in correspondence with the names of boards, and for all mounted parts, the positions of the parts (and the names of the parts if necessary) mounted on the boards, as well as image information and criteria information needed to inspect the parts.

Next, the operator causes the contents of the part classification table 57 for inspection purposes to be displayed on the screen of the display unit 43 and selects, from the part classification table 57 thus displayed, part groups corresponding to the parts whose part positions (mounting positions) have been accepted at step 164. When this is done, inspection condition information of the selected part groups is registered in the criteria data file 53 in correspondence with the parts (step 165). This is identical with the processing of step 115 in FIG. 7.

The operation and processing of steps 164, 165 are repeated with regard to all parts on the reference board SB (step 116).

It is also possible to adopt an arrangement in which a part number table (a part name vs. part group correspondence table), in which part names are correlated with part types and part groups of the parts, is created in advance, and the processing of steps 114, 115 is executed automatically, without operator intervention, while reference is made to this table.

When the above-described processing is concluded for all parts on one reference board SB, this completes the criteria data file. The criteria data file created is subsequently used to verify whether inspection will be carried out correctly or not.

A reference board or a board under inspection having an identical name (identical ID) is used to perform a trial soldering inspection (step 167). The soldering inspection is executed by referring to the criteria data file created previously (the details of soldering inspection processing will be described later). While observing the results of soldering inspection, the operator judges whether the criteria data file created previously is appropriate or not. If the file is appropriate, processing for creating the criteria data file is concluded without any further processing being executed. When the operator decides that the file is inappropriate, the operator corrects the item in the criteria data file deemed to be improper. This correction would be executed by causing the contents of the criteria data file to be displayed on the display screen and revising the image information and criteria information of the relevant part on the screen by key entry. The criteria data file is updated by the corrected data (step 168). The operation and processing of steps 167, 168 are repeated until an appropriate criteria data file 53 is obtained.

The criteria data file is created with regard to all types of boards (all board names) to undergo soldering inspection.

Figure 23:
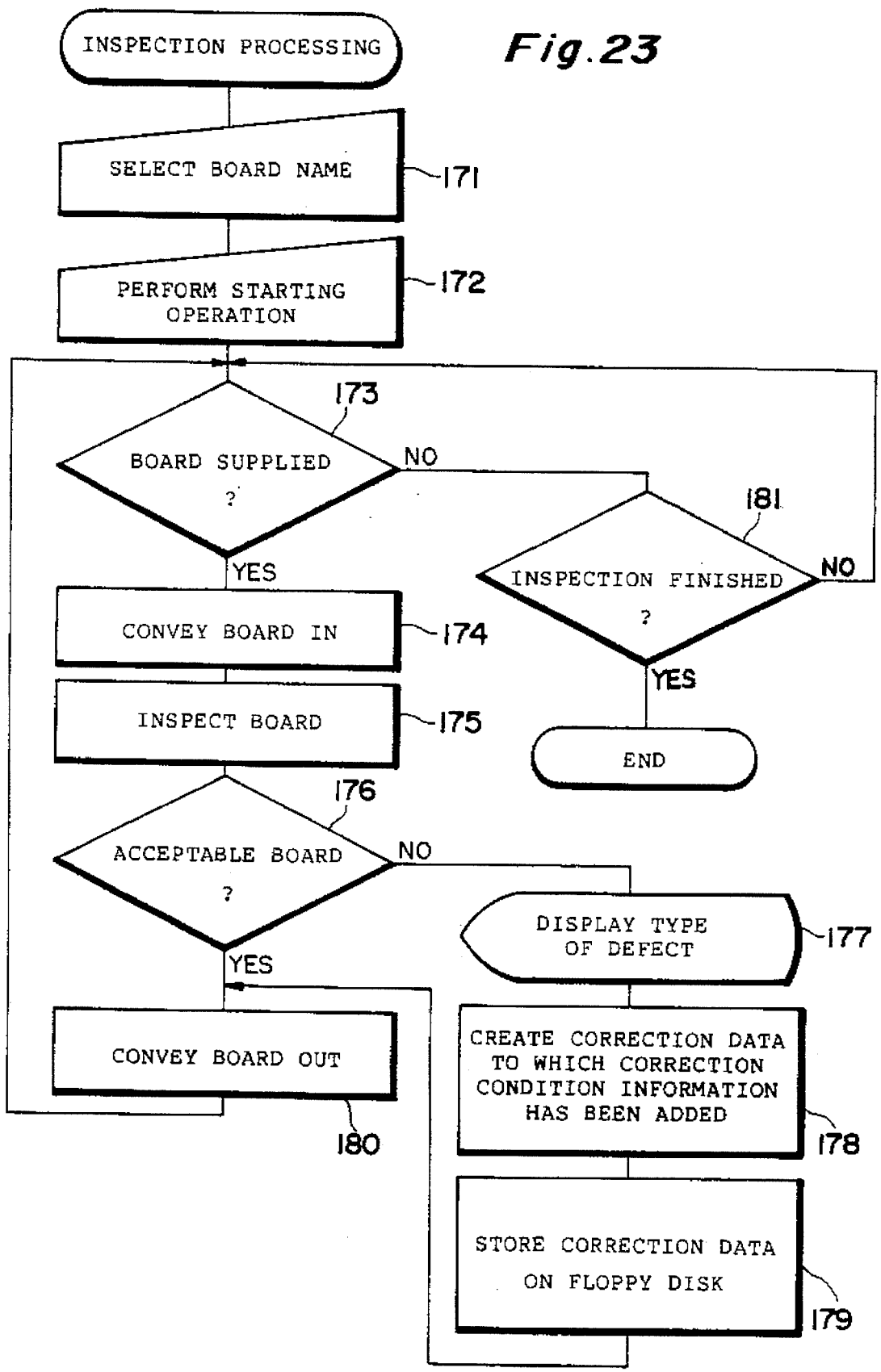
FIG. 23 is a flowchart showing the procedure of inspection processing.

FIG. 23 illustrates the procedure of processing for automatically inspecting soldering.

The name of a board (board name or board ID) to undergo inspection is entered and the start key is pressed (steps 171, 172).

Whether or not the board TB to be inspected has been supplied to the automatic inspection apparatus 30 is checked (173). If the board has been supplied, then the conveyor 31 is actuated to convey the board TB in to the Y-axis table 32 (step 174), whereupon automatic inspection begins.

The control unit 41 controls the X-axis table 33 and Y-axis table 32 to position the first part TA, which is located on the board TB to be inspected, at a prescribed location within the field of view of the image sensing device 35. The latter then images the part TA positioned. The image processor 52 processes the image data obtained on the basis of the image signal outputted by the image sensing device 35, automatically extracts each land area within the inspection zone and calculates the characteristic parameters of each land area, thereby creating a file of data to be inspected.

The created file of data to be inspected is transferred from the image processor 52 to the decision unit 54. The latter compares this file of data to be inspected with the already created criteria data file of the relevant board, judges the quality of soldering of the first part and, if soldering is defective, discriminates the type of defect (step 175).

This inspection is repeatedly executed with regard to all parts TA on the board TB under inspection. If results indicating that all of the parts TA have been soldered favorably are obtained, then the inspected board TB is conveyed out by the conveyor 31 (steps 176, 180). If even one location of one part of the inspected board TB is found to be faulty, the defective part and the type of defect are displayed on the display unit 43 or printed out by the printer 44 (steps 176, 177).

With regard to a part discovered to have a soldering defect, correction condition information for the part type and part group to which the part belongs is read out of the part classification table 58 for correction. This is executed by the operator, who enters the part type and part group, or by making reference to a correspondence table given the correspondence between part names and part groups. Correction data of the kind shown in FIG. 22 is created (step 178), this data including board name (board ID), part position (or part name or part number), position information (e.g., a position taking the center of the part as a reference) representing faulty soldered locations and the correction condition information that has been read out. This correction information is stored in the floppy disk FD by the floppy disk device 45 (step 179). It goes without saying that if a plurality of parts on one board have faulty locations, or if one part has a plurality of faulty locations, the part positions, faulty-location position information and correction condition information regarding these faulty locations are added to the above-described correction data.

Thereafter, a board having faulty soldered locations is conveyed out (step 180). The operation and processing of steps 173–180 are executed with regard to all boards to be inspected (steps 173, 181).

If correction condition information read out of the part classification table 58 for correction is stored in the criteria data table beforehand in addition to the image information and criteria information read out of the part classification table 57 for inspection, it will be unnecessary to refer to the part classification table 58 at step 178.

In a case where the invention is applied to the soldering inspection/correction line illustrated in FIG. 11, 12 or 13, it will suffice if the created correction data is transmitted to the automatic soldering correction apparatus 60 or to the correction unit 60a via the transmission line TL. This would be carried out instead of the processing of step 179.

Third Embodiment

The third embodiment relates to an automatic soldering correction apparatus and an automatic soldering correction method.

Figure 24:
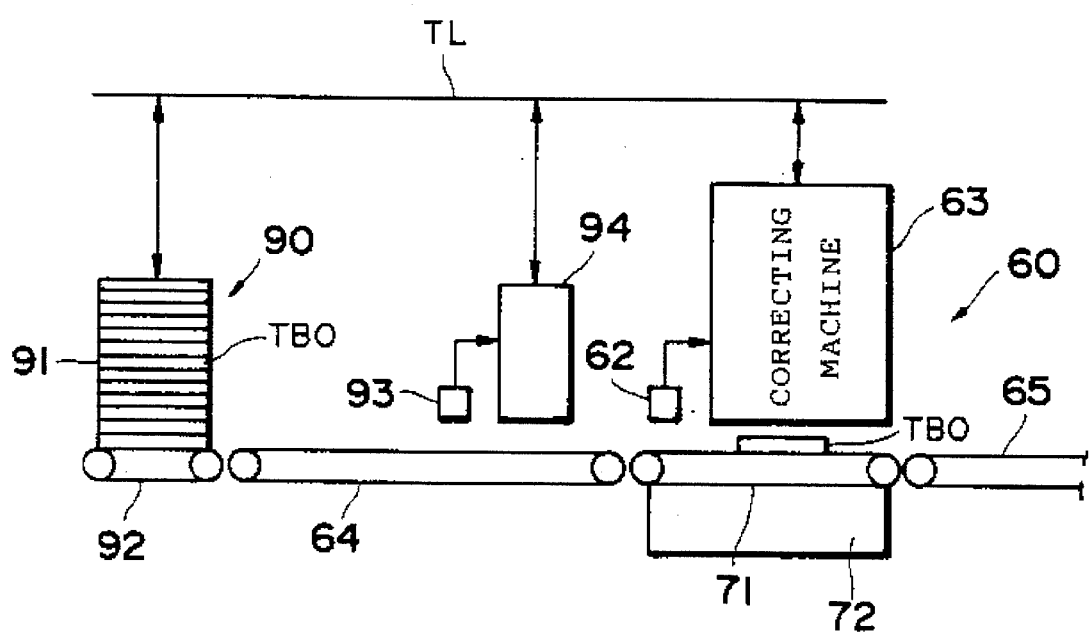
FIG. 24 illustrates an example of the arrangement of a soldering-defect correction line provided with an apparatus for automatically correcting soldering.

FIG. 24 illustrates the arrangement of a soldering-defect correction line provided with the apparatus for automatically correcting soldering 60.

The soldering-defect correction line, which is for automatically correcting faulty soldered locations on the board TBO having a number of parts mounted thereon, has the automatic soldering correction apparatus 60 and a board supply mechanism 90. A first conveyor 64 is provided between the automatic soldering correction apparatus 60 and board supply mechanism 90, and a second conveyor 65 is provided downstream of the automatic soldering correction apparatus 60.

The third embodiment is applicable also to the automatic soldering correction apparatus 60 or automatic soldering correction unit 60a provided in the soldering inspection/correction line described in the second embodiment with reference to FIGS. 10 through 13.

The board supply mechanism 90 stocks boards TBO for which soldering inspection has been completed and supplies the boards to the conveyor 64 one at a time. More specifically, the board supply mechanism 90 comprises a stocker 91 for stocking and accommodating a number of the boards TBO and a board delivery mechanism 92 for delivering the lowermost board TBO from the stocker 91. The leading end of the first conveyor 64 is situated at the delivery end of the board delivery mechanism 92, thereby forming a conveyance path for the boards TBO.

The first conveyor 64 is for conveying the boards TBO, which have been supplied by the board supply mechanism 90, to the automatic soldering correction apparatus 60. The trailing end of this conveyor leads to a board carry-in conveyor 71 in the automatic correction apparatus 60.

An object sensor 93 such as a photoelectric sensor and a character reader 94 are arranged in the proximity of the trailing end of the first conveyor 64. The object sensor 93 senses arrival of the board TBO and applies a signal indicative of object detection to the character reader 94. The latter is for reading the board ID (board name) displayed on the surface of the board TBO. When the object-detection signal has entered from the object sensor 93, the character reader 94 performs a character reading operation and transmits the read board ID to the automatic soldering correction apparatus 60 via the transmission line TL.

The automatic soldering correction apparatus 60 has a construction identical with that of the automatic soldering apparatus 1 illustrated in FIG. 1 and includes the carry-in conveyor 71, an XY table 72, an object sensor 62 and a correcting machine 63.

Figure 25:
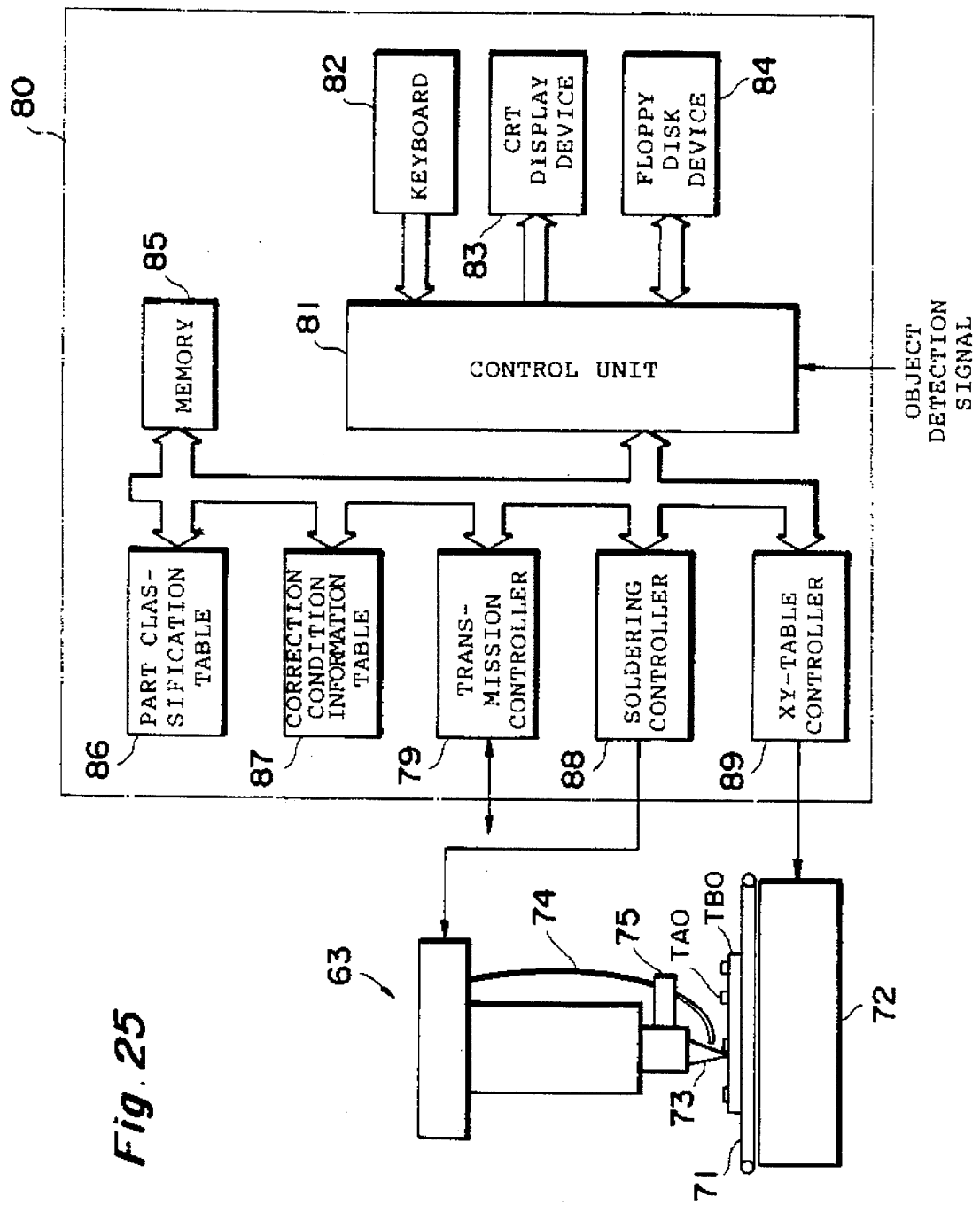
FIG. 25 illustrates the construction of an apparatus for automatically correcting soldering and the construction of a control processing unit thereof.

The correcting machine 63 has a construction basically the same as that of the soldering machine 3 illustrated in FIG. 2. As shown in FIG. 25, the correcting machine 63, which is for applying soldering correcting work to faulty soldered locations on the board TBO, is equipped with an automatic soldering iron 73 and a wire supply mechanism 75 for supplying a solder wire 74 to the position of the tip of the automatic soldering iron 73.

Connected to the correcting machine 63 is a control processor 80. The latter is constituted by a transmission controller 79, a soldering controller 88, an XY-table controller 89, a part classification table 86 for correction purposes, a correction-condition information table 87, a control unit 81, a memory 85, a keyboard 82, a CRT display device 83 and a floppy disk device 84, etc.

The control processor 80 also has a construction basically the same as that of the control processor 20 shown in FIG. 2. The differences are as follows: The transmission controller 79 controls transmission of data to and from the board supply mechanism 90 and character reader 94 via the transmission line TL. A floppy disk on which information indicative of the result of inspection has been stored is set in the floppy disk device 84, and information indicative of result of inspection of the board TBO is read out of this floppy disk. It is also possible to enter this information using the keyboard 82. The part classification table 86 for correction purposes and a correction-condition information table 87 will be described later.

Automatic inspection of soldering of parts mounted on a board is performed by the automatic inspection apparatus of the second embodiment described above and by other types of automatic inspection apparatus to obtain information, which represents the results of inspection, from these automatic inspection apparatus. This information may be obtained also by visual inspection relying upon human intervention, by an in-circuit board test or by X-ray inspection. In any case, the information indicative of the result of inspection in this embodiment is stored on the floppy disk, as set forth above.

According to this embodiment, the information indicative of the result of inspection stored on the floppy disk includes, for each board having faulty soldered locations, the ID (or board name) of the board, the positions of parts (and the names of the parts or part numbers if necessary) having faulty soldered locations, position information (e.g., pin numbers in the case of an IC or positions for which the centers of the respective parts serve as the reference) for specifying the faulty soldered locations and the types of soldering defects. The type of soldering defect includes a soldering-defect item indicating the amount of solder is excessive, insufficient, etc. If necessary, the type of a soldering defect can include degree of excess and degree of insufficiency.

Correction condition information for correcting a soldering defect is contained in the correction data of the second embodiment (FIG. 22) in addition to the inspection-result information set forth above. According to this embodiment, the correction condition information is taught to the automatic correction apparatus 60 using the part classification table 86 for correction purposes.

The part classification table 86 for correction purposes stores beforehand, for each part type and part group, correction condition information necessary for correcting faulty soldered locations, e.g., soldering correction condition information such as position and angles (the aforementioned inclination angle α and azimuth angle β) of the automatic soldering iron 73 with respect to a soldering location, amount of solder supplied and heating time, etc. This table may be considered to be the same as the part classification table for correction shown in FIG. 17.

In case of excessive solder, correction of a faulty soldered location is performed by bringing the automatic soldering iron 73 close to a land to melt and remove the superfluous solder. In case of insufficient solder, correction of a faulty soldered location is performed by supplying solder to the land so as to supplement the solder between the land and the electrode. In a case where information relating to degree of excessive solder and degree of insufficient solder is included as information representing the result of inspection, the amount of solder removal or replenishment is controlled based upon these items of information.

The part classification table 86 for correction purposes can be changed or created anew as necessary by a processing procedure identical with that shown in FIG. 19.

Figure 26:
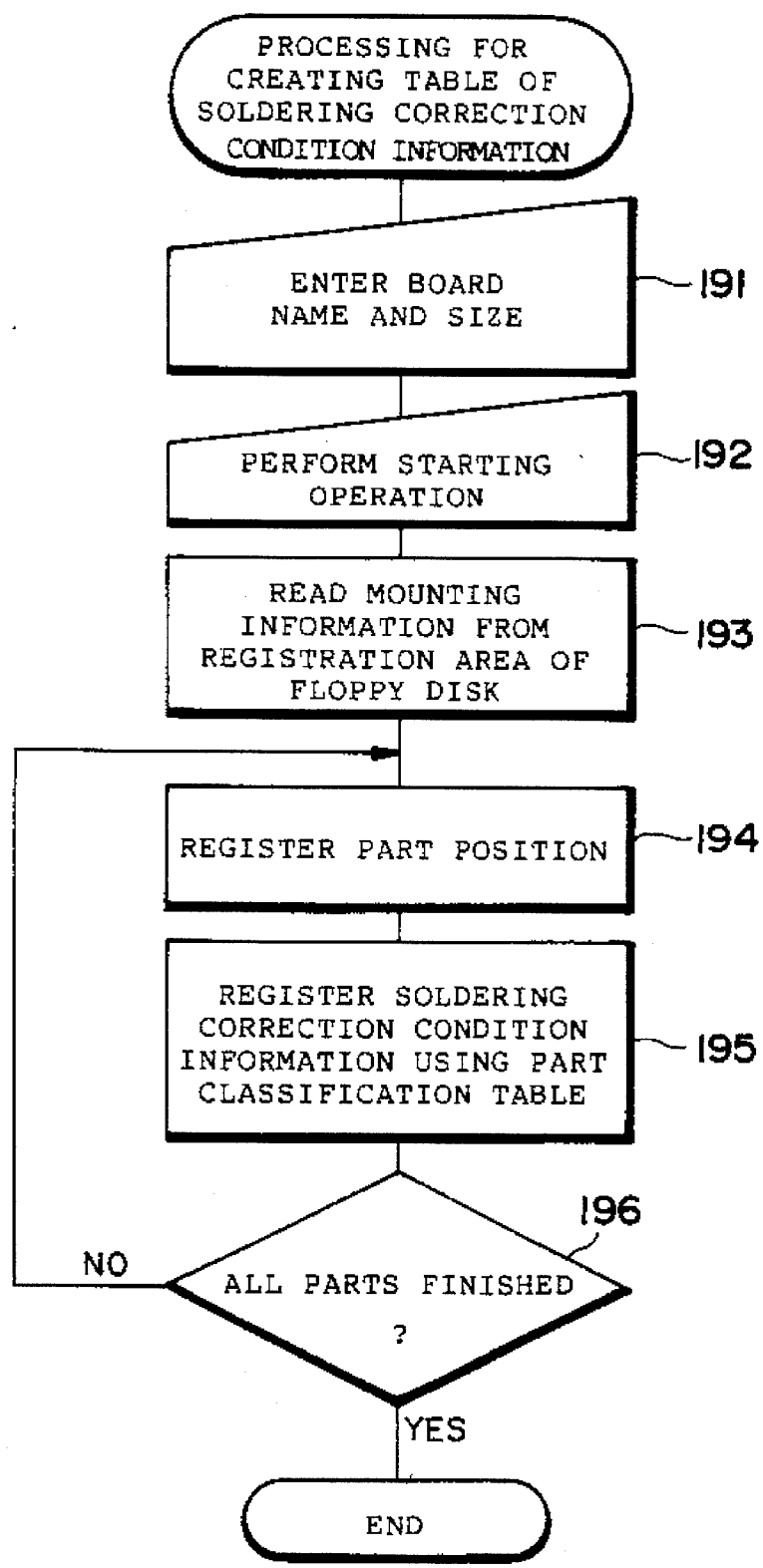
FIG. 26 is a flowchart illustrating a processing procedure for creating a table of soldering correction condition information.

FIG. 26 illustrates a processing procedure for creating the soldering correction-condition information table 87. The soldering correction-condition information table 87 also is created for each board name (board ID). The correction-condition information table created is illustrated in FIG. 27.

The operator enters a board name (board ID) and board size from the keyboard 82 (step 191). When the operator presses the start key, the floppy disk device 84 is actuated so that part mounting information stored on the floppy disk and regarding an entered board name, e.g., part names (part numbers, part positions, etc.) mounted on the board, are read out (step 193). The board name and part position information (and part names or part numbers if necessary) are stored in the table of correction condition information (step 194).

Next, the operator causes the contents of the part classification table 86 for correction to be displayed on the screen of the CRT display unit 83 and selects a part group, which corresponds to a mounted part, from the part classification table 86. When this is done, the correction condition information of the selected part group is registered in the table 87 of correction condition information in correspondence with the part (step 195).

The operation and processing of steps 194, 195 are repeated with regard to all mounted parts on the board for which treatment has been designated (step 196).

It is also possible to adopt an arrangement in which a part number table (a part name vs. part group correspondence table), in which part names are correlated with part types and part groups of the parts, is created in advance, and the processing of steps 194, 195 is executed automatically, without operator intervention, while reference is made to this table.

Figure 28:
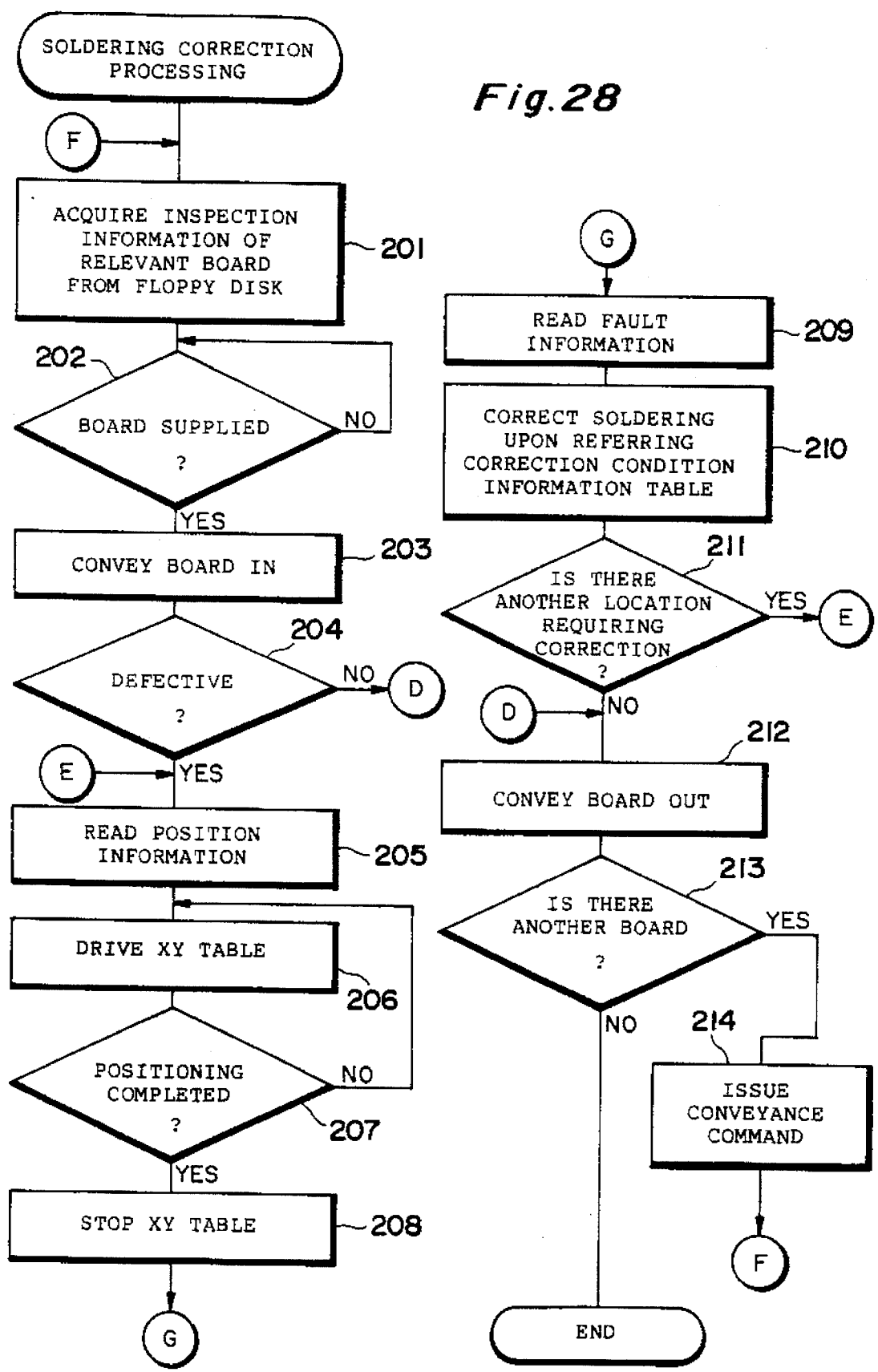
FIG. 28 is a flowchart illustrating a procedure of processing for correcting soldering.

FIG. 28 is a procedure of processing, executed by the control processor 80, for automatically correcting soldering.

A floppy disk on which information indicative of the results of inspection has been stored is inserted in the floppy disk device 84. As mentioned above, this information includes board ID (board name) of a board possessing faulty soldered locations, positions (part position and position of defect location) of the faulty soldered locations, and the types of soldering defects.

When the board supply mechanism 90 supplies a first board TBO to the first conveyor 64, the latter conveys the board TBO toward the automatic soldering correction apparatus 60. When the board TBO arrives at the trailing end of the conveyor 64, the object sensor 93 senses this, the character reader 94 reads the board ID of the board TBO and transmits the board ID to the control processor 80 of the automatic correction apparatus 60.

Upon receiving the board ID from the character reader 94, the control unit 81 of the control processor 80 commands the floppy disk device 84 to read the inspection-result information (if there is any) pertinent to the received board ID from the floppy disk and stores this information in the memory 85 (step 201). As a result, the control unit 81 is capable of ascertaining at which location on the delivered board TBO a soldering defect is present as well as the kind of soldering defect.

When the board TBO is sent to and placed upon the board carry-in conveyor 71, the object sensor 62 senses this fact (step 202) and the board carry-in conveyor 71 is actuated to bring the board TBO to a prescribed position (step 203).

In a case where the result of accessing the floppy disk indicates that there is no inspection-result information regarding the board of the received board ID, or in a case where stored data indicates no defective locations on a board of the received board ID, this means that the board TBO that has been conveyed in does not require any soldering correction work. Accordingly, the board TBO is conveyed out as is (steps 204, 212).

With regard to a board TBO having a soldering defect, first the control unit 81 reads the initial part position having a faulty soldered location and the position information representing this faulty location out of the memory 85, controls the operation of the XY table 72 through the XY-table controller 89 based upon the position information and positions the tip of the automatic soldering iron 73 of the correcting machine 63 at the relevant position (steps 204, 205, 206, 207, 208).

After stopping the XY table 72, the control unit 81 reads information relating to the type of defect corresponding to the position information out of the memory 85 (step 209).

The control unit 81 then reads the soldering correction-condition data, which corresponds to the position information of the faulty location and the type of fault read out of the memory 85, out of the table 87 of correction condition information, and performs a correction operation by controlling the soldering controller 88 in accordance with this correction condition information (step 210).

By way of example, if the type of defect is insufficient solder, the tip of the heated automatic soldering iron 73 is brought into contact with the proper region and the solder wire 74 is supplied to add the necessary amount of molten solder. If the type of defect is excessive amount of solder, the tip of the heated automatic soldering iron 73 is brought into contact with the proper region to melt and remove the excess solder. The melted solder is withdrawn by a suction tube if necessary.

If there is another faulty location after correction work is applied to one location (step 211), the program returns to step 205, the position information regarding the next faulty soldered location is read out and similar correction work is executed. If there are no longer any faulty soldered locations, the control unit 81 actuates the board carry-in conveyor 71 so that the board whose correction work has been completed is delivered to the second conveyor 65 (step 212).

It is determined whether a board TBO remains in the stocker 91 of the board supply mechanism 90, that is, whether the entered number of boards have passed through the automatic correction apparatus 60 (step 213). If a board not yet corrected still remains, the control unit 81 sends a conveyance command from the transmission controller 79 to the board supply mechanism 90 so that the next board is conveyed (step 214). If there are no longer any uncorrected boards, the operation for correcting faulty soldered locations with regard to all boards is concluded.

As a method of correcting soldering defects, an arrangement may be adopted in which solder on a board is removed, after which soldering is performed by supplying a prescribed amount of solder.

An arrangement may be adopted in which the correction data (FIG. 22) obtained in the second embodiment described above is utilized. In such case it will be unnecessary to execute the processing for creating the part classification table 86 for correction purposes and the table of correction condition information shown in FIG. 26. The correction work can be carried out using correction data instead of the table 87 of correction condition information and the inspection-result information on a floppy disk.

Figure 29:
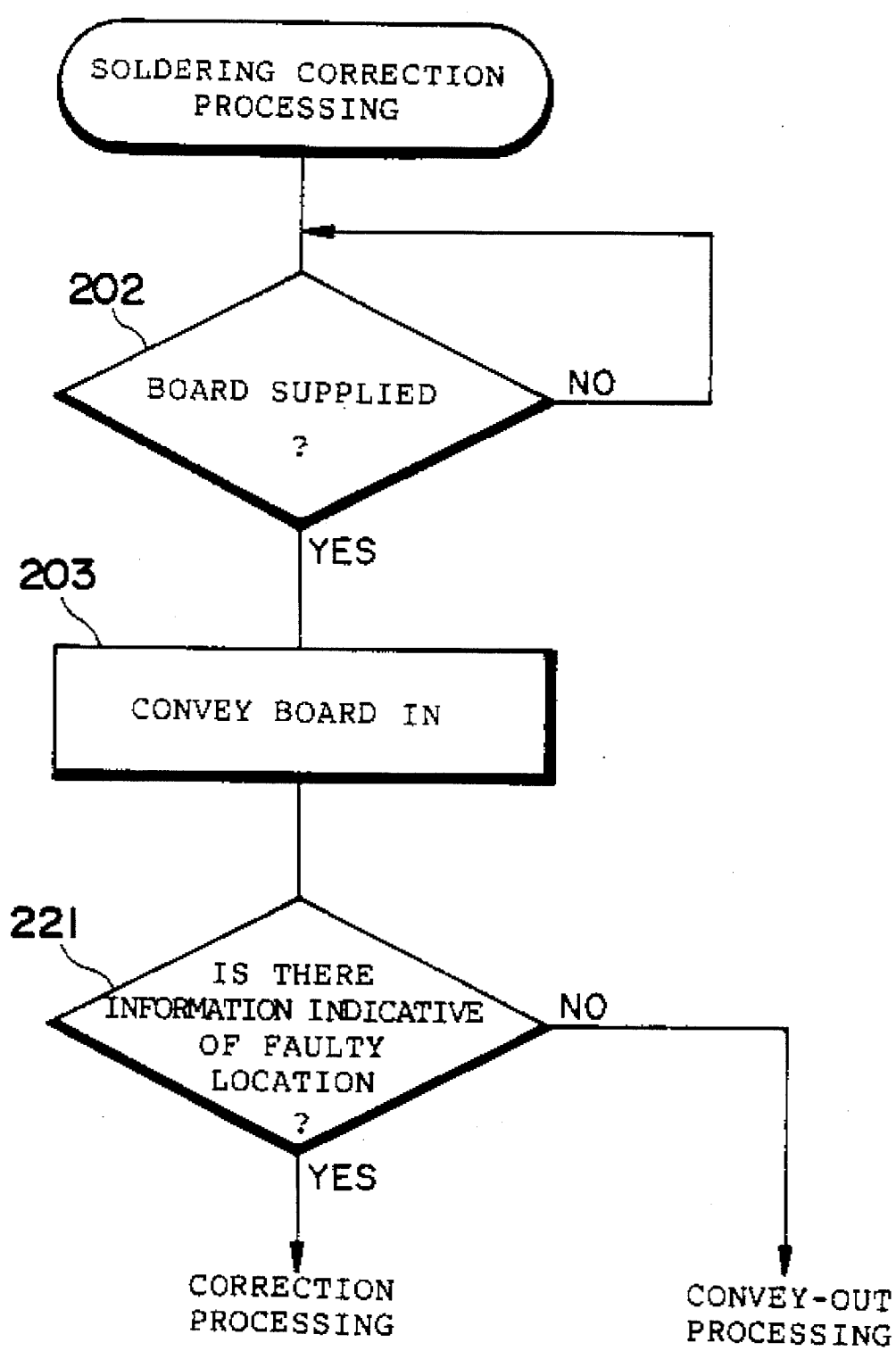
FIG. 29 is a flowchart showing another example of a procedure of processing for correcting soldering.
Figure 30:
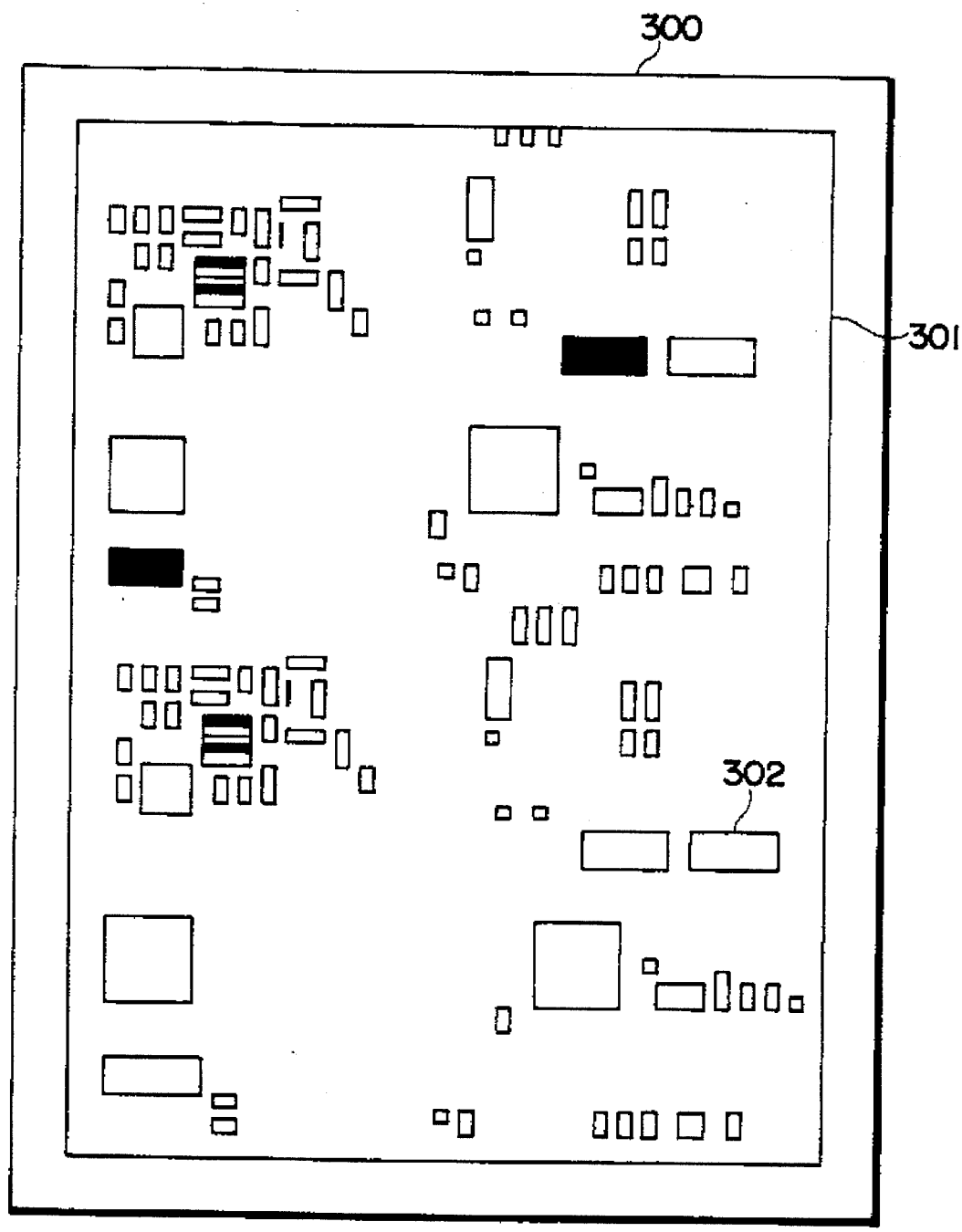
FIG. 30 shows an example of recording paper outputted by an automatic inspection apparatus according to the prior art.

FIG. 29 illustrates the correction work in the automatic correction apparatus provided in the inspection/correction line shown in FIG. 11.

The results of inspection obtained by the automatic inspection apparatus 30 are sent to the automatic correction apparatus 60 via the transmission line TL at the same time that the board TBO is conveyed out. When the board TBO is sensed by the object sensor 62 (step 202), this board is brought to the automatic correction apparatus 60 immediately by the carry-in conveyor 71 (step 203). If a faulty soldered location exists (step 221), the correction operation is carried out. If there are no faulty soldered locations, the board is conveyed out from the automatic correction apparatus 60 as is.

When inspection result information relating to a faulty soldered location is applied to the control unit 81, the latter reads the soldering correction condition information relating to the pertinent part out of the part classification table 86 for correction directly and performs a soldering correction based upon this correction condition information. As a result, processing for creating the table of correction condition information can be abbreviated.

Industrial Applicability

The automatic soldering apparatus and method, the automatic soldering inspection apparatus and method and the automatic soldering correction apparatus and method according to the present invention are utilized effectively in processes for mounting many electronic parts on printed circuit boards at factories and the like.

What is claimed is:

1. An apparatus for providing information to an automatic soldering apparatus, comprising:

first memory means for storing soldering condition information for different classifications of parts;

second memory means for storing, for each of multiple boards, identification codes of parts that are to be mounted on a board;

third memory means for storing a corresponding relationship between the identification codes of the parts and part classifications to which the parts belong;

input means for entering an identification code of a board; and means for reading from said second memory means identification codes for all parts that are to be mounted on a board whose identification code has been entered by said input means, for reading soldering condition information suited to the read parts from said first memory means upon referring to the corresponding relationship stored in said third memory means, and for creating a soldering-condition data table indicating the correlation between the board, the parts to be mounted on the board and the soldering condition information suited to the parts.

2. A method of providing information to an automatic soldering apparatus, comprising the steps of:

storing soldering condition information in first memory means for each classification of parts;

storing identification codes of parts, which are to be mounted on a board in second memory means for each board;

entering an identification code of a board; and with regard to a board whose identification code has been entered, reading identification codes for all parts that are to be mounted on the board from said second memory means, reading soldering condition information of classifications to which the read parts belong from said first memory means, and storing the read part identification codes and the read soldering condition information in correlated form in a soldering-condition data table.

3. A method of providing information according to claim 2, further comprising the steps of:

displaying part identification codes read from said second memory means on a display unit;

displaying classifications of parts stored in said first memory means on the display unit;

entering from an input unit a classification to which the parts corresponding to the displayed part identification codes belong from among the displayed classifications of parts; and reading soldering condition information that corresponds to the entered part classification from the first memory means and correlating this information with the parts displayed.

4. A method of providing information according to claim 2, further comprising the steps of:

storing a corresponding relationship between identification codes of parts and part classifications to which these parts belong in third memory means; and discriminating, by referring to the corresponding relationship in said third memory means, a part classification to which a part corresponding to a part identification code read out of said second memory means belongs, reading soldering condition information that corresponds to the discriminated part classification from said first memory means; and correlating the information with the part identification code.

5. A soldering inspection apparatus comprising:

inspecting means for discriminating soldering quality and positions of parts mounted on a board to detect soldering defects;

first memory means for storing information corresponding to parts that have been mounted on the board;

second memory means for storing correction condition information necessary for correcting faulty soldered locations for each classification of parts; and means for reading, when a soldering defect of a part has been detected by said inspecting means, correction condition information that corresponds to a classification to which the part belongs from said second memory means, and creating correction data by correlating position information representing the location at which the soldering defect has been discriminated and the read correction condition information.

6. A soldering inspection apparatus according to claim 5, further comprising:

display means for displaying an information identifying detected part when a faulty soldering location of the part has been detected by said inspecting means; and means for inputting the classification to which the displayed part belongs;

wherein said means for creating correction data reads correction condition information corresponding to the classification inputted by said input means from said second memory means and correlates this information with the detected part.

7. A soldering inspection apparatus according to claim 5, further comprising third memory means for storing a corresponding relationship between parts and classifications to which these parts belong; wherein said means for creating correction data correlates correction condition information that corresponds to a part for which a soldering defect has been detected with the detected part by referring to the corresponding relationship stored in said third memory means.

8. A soldering inspection apparatus according to claim 5, wherein said means for creating correction data stores created correction data in memory means.

9. A soldering inspection apparatus according to claim 5, wherein said means for creating correction data includes means for transmitting created correction data to an automatic soldering correction apparatus.

10. A soldering inspection apparatus according to claim 5, further comprising an automatic soldering correction apparatus for correcting a faulty soldering location on the basis of correction data created by said means for creating correction data.

11. A soldering inspection apparatus according to claim 5, wherein types of soldering defects include insufficient solder, excessive solder and a missing part.

12. A soldering inspection apparatus according to claim 5, wherein the correction condition information conforms to the type of soldering defect.

13. A soldering inspection apparatus comprising:

memory means in which information identifying parts mounted on a board, criteria data for discriminating soldering quality of the parts and correction condition information necessary for correcting faulty soldered locations relating to the parts are stored in correlated form;

inspecting means for discriminating soldering quality and positions of the parts that have been mounted on the board in accordance with the criteria data stored in said memory means to detect a soldering defect; and means for reading, when a soldering defect of a part has been detected by said inspecting means, correction condition information that corresponds to the part from said memory means, and means for creating correction data by correlating position information representing a location at which the soldering defect has been detected and the read correction condition information.

14. A soldering inspection apparatus according to claim 13, wherein said creating means stores the created correction data in memory means.

15. A soldering inspection apparatus according to claim 13, wherein said creating means includes means for transmitting created correction data to an automatic soldering correction apparatus.

16. A soldering inspection apparatus according to claim 13, further comprising an automatic soldering correction apparatus for correcting a faulty soldering location on the basis of correction data created by said creating means.

17. A soldering inspection apparatus according to claim 13, wherein types of soldering defects include insufficient solder, excessive solder and a missing part.

18. A soldering inspection apparatus according to claim 13, wherein the correction condition information conforms to the type of soldering defect.

19. A soldering inspection apparatus comprising:

inspecting means for discriminating soldering quality and positions of parts mounted on a board to detect soldering defects;

memory means for storing information identifying parts mounted on the board and correction condition information necessary for correcting faulty soldered locations relating to the parts in correlated form; and means for reading when a soldering defect of a part has been detected by said inspecting means, correction condition information that corresponds to the part from said memory means, and means for creating correction data by correlating position information representing a location at which the soldering defect has been discriminated and the read correction condition information.

20. A soldering inspection method comprising the steps of:

storing information identifying parts that have been mounted on a board in first memory means;

storing correction condition information necessary for correcting a faulty soldered location in second memory means in advance for each classification of parts;

discriminating soldering quality and positions of the parts mounted on the board to detect soldering defects; and when a soldering defect of a part has been detected, reading correction condition information that corresponds to a classification to which the part belongs from said second memory means and creating correction data by correlating position information representing the location at which the soldering defect has been detected and the read correction condition information.

21. A soldering inspection method according to claim 20, further comprising the steps of:

displaying information identifying a part for which a soldering defect has been detected when the soldering defect is detected;

entering a classification to which the displayed part belongs; and reading correction condition information that corresponds to the entered classification from said second memory means and correlating this information with the part for which a defect has been detected.

22. A soldering inspection method according to claim 20, further comprising the steps of:

storing a corresponding relationship between parts and classifications to which these parts belong in third memory means; and correlating correction condition information that corresponds to a part for which a soldering defect has been detected with the detected part by referring to the corresponding relationship stored in said third memory means.

23. A soldering inspection method according to claim 20, wherein created correction data is stored in memory means.

24. A soldering inspection method according to claim 20, wherein created correction data is transmitted to an automatic soldering correction apparatus.

25. A soldering inspection method according to claim 20, wherein a faulty soldering location on a board is corrected on the basis of created correction data.

26. A soldering inspection method according to claim 20, wherein types of soldering defects include insufficient solder, excessive solder and a missing part.

27. A soldering inspection method according to claim 20, wherein the correction condition information is decided in conformity with the type of soldering defect.

28. A soldering inspection method comprising the steps of:

storing, in memory means in correlated form, information about parts mounted on a board, criteria data for discriminating soldering quality of the parts and correction condition information necessary for correcting faulty soldered locations relating to the parts;

discriminating soldering quality and positions of the parts mounted on the board in accordance with the criteria data stored in said memory means to defect a soldering defect; and when a soldering defect of a part has been detected, reading correction condition information that corresponds to the part from said memory means, and creating correction data by correlating position information representing a location at which the soldering defect has been detected and the read correction condition information.

29. A soldering inspection method according to claim 28, wherein created correction data is stored in memory means.

30. A soldering inspection method according to claim 28, wherein created correction data is transmitted to an automatic soldering correction apparatus.

31. A soldering inspection method according to claim 28, wherein a faulty soldering location on a board is corrected on the basis of the created correction data.

32. A soldering inspection method according to claim 28, wherein types of soldering defects include insufficient solder, excessive solder and a missing part.

33. A soldering inspection method according to claim 28, wherein the correction condition information is decided in conformity with the type of soldering defect.

34. A soldering inspection method comprising the steps of:

storing, in memory means in correlated form, information about parts mounted on a board and correction condition information necessary for correcting faulty soldered locations relating to the parts;

discriminating soldering quality and positions of the parts mounted on the board to detect a soldering defect for a part; and when a soldering defect for a part has been detected, reading correction condition information that corresponds to the part from said memory means and creating correction data by correlating position information representing a location at which the soldering defect has been detected and the read correction condition information.

35. An automatic soldering correction apparatus comprising:

first memory means for storing correction condition information necessary for correcting faulty soldered locations for each classification of parts;

second memory means for storing information identifying mounted parts on a board;

third memory means for storing a corresponding relationship between the parts and part classifications to which the parts belong;

means for reading correction condition information suited to a mounted part from said first memory means upon referring to the corresponding relationship stored in said third memory means; and means for creating a correction-condition information table in which the parts and correction condition information corresponding thereto are correlated.

36. An automatic soldering correction apparatus according to claim 35, further comprising:

inspection-result input means for entering position information of a faulty soldered location with regard to a part having a faulty soldered location on the board on which the part is mounted; and soldering correcting means for reading correction condition information that corresponds to the part having the faulty soldered location for which the position information has been entered by said inspection-result input means from said correction-condition information table, and executing a soldering correction operation of the faulty soldered location of the mounted part on the board in accordance with the read correction condition information.

37. An automatic soldering correction apparatus according to claim 35, wherein said inspection-result input means comprises means for reading inspection results from fourth memory means in which the inspection results have been stored.

38. An automatic soldering correction apparatus according to claim 35, wherein said inspection-result input means comprises means for receiving inspection results transmitted thereto.

39. An automatic soldering correction apparatus comprising:

first memory means for storing correction condition information necessary for correcting faulty soldered locations for each classification of parts;

second memory means for storing a corresponding relationship between parts and part classifications to which the parts belong;

inspection-result input means for entering position information for a faulty soldered location with regard to a part having a faulty soldered location on a board on which the part is mounted; and soldering correcting means for reading correction condition information that corresponds to the part having the faulty soldered location for which the position information has been entered by said inspection-result input means from said first memory means upon referring to the corresponding relationship stored in said second memory means, and executing a soldering correction operation of the faulty soldered location of the mounted part on the board in accordance with the read correction condition information.

40. An automatic soldering correction apparatus according to claim 39, wherein said inspection-result input means comprises means for reading inspection results from third memory means in which the inspection results have been stored.

41. An automatic soldering correction apparatus according to claim 39, wherein said inspection-result input means comprises means for receiving inspection results transmitted thereto.

42. An automatic soldering correction method comprising the steps of:

storing correction condition information necessary for correcting faulty soldered locations in first memory means for each classification of parts;

storing information about mounted parts mounted on a board in second memory means;

displaying information about the mounted parts that has been stored in said second memory means on a display unit;

entering a part classification to which the parts corresponding to the displayed information belong;

reading correction condition information that corresponds to the entered part classification from said first memory means and creating a correction-condition information table in which the displayed parts and the read correction condition information are correlated;

giving information about a part having a faulty soldered location on a board on which the part has been mounted along with position information for the faulty location;

reading correction condition information that corresponds to the given part having the faulty location from said correction-condition information table; and executing a soldering correction operation of the faulty location in accordance with the read correction condition information.

43. An automatic soldering correction method comprising the steps of:

storing correction condition information necessary for correcting faulty soldered locations in memory means for each classification of parts;

giving information about a part having a faulty soldered location on a board on which the part has been mounted and position information of the faulty location;

reading correction condition information that corresponds to the given part having the faulty location from said memory means; and executing a soldering correction operation of the faulty location in accordance with the read correction condition information.

44. An automatic soldering apparatus comprising:

first memory means for storing soldering condition information in correspondence with parts;

second memory means for storing information relating to parts to be mounted on a board for each board;

input means for entering an identification code of a board; and means for reading, with regard to a board whose identification code has been entered by said input means, information about all parts that are to be mounted on the board from said second memory means, reading soldering condition information suited to the read parts from said first memory means, and creating a soldering-condition data table indicating correlation between the board, the parts to be mounted on the board and the soldering condition information suited to the parts.

45. An automatic soldering correction apparatus comprising:

first memory means for storing correction condition information necessary for correcting faulty soldered locations in correspondence with parts;

a second memory means for storing information relating to mounted parts on a board on which parts are mounted;

means for reading correction condition information suited to a mounted part on the board from said first memory means and creating a correction-condition information table in which the parts on the board and correction condition information corresponding thereto are correlated;

inspection-result input means for entering position information for a faulty soldered location with regard to a part having a faulty soldered location on the board on which the part is mounted; and soldering correcting means for reading correction condition information that corresponds to the part having the faulty soldered location for which the position information has been entered by said inspection-result input means from said correction-condition information table, and executing a soldering correction operation of the faulty soldered location of the mounted part on the board in accordance with the read correction condition information.

46. An automatic soldering correction apparatus comprising:

first memory means for storing correction condition information necessary for correcting faulty soldered locations in correspondence with parts;

inspection-result input means for entering position information of a faulty soldered location with regard to a part having a faulty soldered location on the board on which the part is mounted; and soldering correcting means for reading correction condition information, which corresponds to the part having the faulty soldered location for which the position information has been entered by said inspection-result input means from said memory means, and executing a soldering correction operation of the faulty soldered location of the mounted part on the board in accordance with the read correction condition information.

* * * * *